US012032364B2

(12) United States Patent
Chai et al.

(10) Patent No.: US 12,032,364 B2
(45) Date of Patent: Jul. 9, 2024

(54) COMPUTER-IMPLEMENTED METHOD FOR DEFECT ANALYSIS, COMPUTER-IMPLEMENTED METHOD OF EVALUATING LIKELIHOOD OF DEFECT OCCURRENCE, APPARATUS FOR DEFECT ANALYSIS, COMPUTER-PROGRAM PRODUCT, AND INTELLIGENT DEFECT ANALYSIS SYSTEM

(71) Applicant: BOE Technology Group Co., Ltd., Beijing (CN)

(72) Inventors: Dong Chai, Beijing (CN); Tian Lan, Beijing (CN); Haohan Wu, Beijing (CN); Yue Tang, Beijing (CN); Guoliang Shen, Beijing (CN); Fei Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 459 days.

(21) Appl. No.: 17/438,719

(22) PCT Filed: Dec. 3, 2020

(86) PCT No.: PCT/CN2020/133688
§ 371 (c)(1),
(2) Date: Sep. 13, 2021

(87) PCT Pub. No.: WO2022/116111
PCT Pub. Date: Jun. 9, 2022

(65) Prior Publication Data
US 2022/0374004 A1 Nov. 24, 2022

(51) Int. Cl.
*G05B 19/418* (2006.01)
*G06F 18/214* (2023.01)

(52) U.S. Cl.
CPC ... *G05B 19/41875* (2013.01); *G05B 19/4183* (2013.01); *G06F 18/214* (2023.01)

(58) Field of Classification Search
CPC . G06F 18/214; G06F 30/398; G05B 23/0281; H01L 22/20
See application file for complete search history.

(56) References Cited

U.S. PATENT DOCUMENTS 11,354,155 B1 * 6/2022 Post ............... G06F 18/214
2006/0041448 A1 2/2006 Patterson et al.
(Continued)

FOREIGN PATENT DOCUMENTS

CN 103151287 A 6/2013
CN 106646935 A 5/2017
(Continued)

OTHER PUBLICATIONS

International Search Report & Written Opinion mailed Sep. 8, 2021, regarding PCT/CN2020/133688.

*Primary Examiner* — Mohammad Ali
*Assistant Examiner* — Dhruvkumar Patel
(74) *Attorney, Agent, or Firm* — Intellectual Valley Law, P.C.

(57) ABSTRACT

A computer-implemented method for defect analysis is provided. The computer-implemented method includes calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score. A respective one of the plurality of device operations (Continued)

is a respective device defined by a respective operation site at which the respective device perform a respective operation.

14 Claims, 16 Drawing Sheets

(56) References Cited

U.S. PATENT DOCUMENTS

| | | | |
|---|---|---|---|
| 2008/0077269 A1* | 3/2008 | Lee | G05B 19/4184 |
| | | | 700/121 |
| 2010/0191941 A1 | 7/2010 | Yamagata et al. | |
| 2017/0024446 A1* | 1/2017 | O'Kane | G06F 16/2282 |
| 2020/0026819 A1* | 1/2020 | Leu | G06F 30/398 |
| 2020/0125785 A1* | 4/2020 | Chang | G06T 7/0004 |
| 2020/0241517 A1* | 7/2020 | Gattu | G05B 23/0272 |
| 2021/0066141 A1* | 3/2021 | Phan | G06N 3/045 |
| 2021/0117861 A1* | 4/2021 | Burch | G06N 5/04 |

FOREIGN PATENT DOCUMENTS

| | | | | |
|---|---|---|---|---|
| CN | 108318504 A | | 7/2018 | |
| CN | 108319052 A | | 7/2018 | |
| CN | 109858770 A | | 6/2019 | |
| CN | 110515931 A | | 11/2019 | |
| CN | 110837717 A | | 2/2020 | |
| CN | 111159645 A | | 5/2020 | |
| CN | 111562458 A | | 8/2020 | |
| CN | 111669281 A | | 9/2020 | |
| CN | 111695626 A | * | 9/2020 | ....... G06F 18/23213 |
| CN | 114429256 A | * | 5/2022 | |
| KR | 20220041711 A | * | 4/2022 | |
| WO | 2014176816 A1 | | 11/2014 | |

* cited by examiner calculating a plurality of weight-of-evidence (WOE) scores respectively for a plurality of device operations with respect to defects occurred during a fabrication period, a higher WOE score indicating a higher correlation between a defect and a device operation

ranking the plurality of WOE scores to obtain a list of selected device operations highly correlated with the defects occurred during the fabrication period, device operations in the list of selected device operations having a WOE score greater than a first threshold score

FIG. 2 obtaining candidate contact areas of a plurality of contact devices, wherein a respective one of the plurality of contact devices is a respective device having a contact, in a respective chamber, with an intermediate substrate during the fabrication period, and a respective candidate contact area comprises a respective theoretical contact area and a respective margin area surrounding the respective theoretical contact area

obtaining coordinates respectively of defect points during the fabrication period

selecting a plurality of defect contact areas from the candidate contact areas, a respective one of the plurality of defect contact areas enclosing at least one of the defect point coordinates

obtaining a list of selected contact devices, wherein a respective selected contact device is a respective contact device having a contact with an intermediate substrate in a respective defect contact area

FIG. 3

COMPUTER-IMPLEMENTED METHOD FOR DEFECT ANALYSIS, COMPUTER-IMPLEMENTED METHOD OF EVALUATING LIKELIHOOD OF DEFECT OCCURRENCE, APPARATUS FOR DEFECT ANALYSIS, COMPUTER-PROGRAM PRODUCT, AND INTELLIGENT DEFECT ANALYSIS SYSTEM

CROSS-REFERENCE TO RELATED APPLICATION

This application is a national stage application under 35 U.S.C. § 371 of International Application No. PCT/CN2020/133688, filed Dec. 3, 2020, the contents of which are incorporated by reference in the entirety.

TECHNICAL FIELD

The present invention relates to display technology, more particularly, to a computer-implemented method for defect analysis, a computer-implemented method of evaluating likelihood of defect occurrence, an apparatus for defect analysis, a computer-program product, and intelligent defect analysis system.

BACKGROUND

Distributed computing and distributed algorithms have become prevalent in a wide variety of contexts, for reasons of increased performance and load capacity, high availability and failover and faster access to data. With the development of big data, cloud computing, artificial intelligence and other technologies, big data analytics related technologies are widely used in various fields of the manufacturing industry.

SUMMARY

In one aspect, the present disclosure provides a computer-implemented method for defect analysis, comprising calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score; wherein a respective one of the plurality of device operations is a respective device defined by a respective operation site at which the respective device perform a respective operation.

Optionally, the computer-implemented method further comprises obtaining candidate contact areas of a plurality of contact devices, wherein a respective one of the plurality of contact devices is a respective device having a contact, in a respective chamber, with an intermediate substrate during the fabrication period, and a respective candidate contact area comprises a respective theoretical contact area and a respective margin area surrounding the respective theoretical contact area; obtaining coordinates respectively of defect points during the fabrication period; selecting a plurality of defect contact areas from the candidate contact areas, a respective one of the plurality of defect contact areas enclosing at least one of the defect point coordinates; and obtaining a list of selected contact devices, wherein a respective selected contact device is a respective contact device having a contact with an intermediate product in a respective defect contact area.

Optionally, the computer-implemented method further comprises obtaining one or more candidate defective devices based on the list of selected device operations highly correlated with the defects and the list of selected contact devices; wherein a respective one of the one or more candidate defective devices is a device in the list of selected contact devices and also a device in the list of selected device operations.

In another aspect, the present disclosure provides an apparatus for defect analysis, comprising a memory; one or more processors; wherein the memory and the one or more processors are connected with each other; and the memory stores computer-executable instructions for controlling the one or more processors to calculate a plurality of weight-of-evidence (WOE) scores respectively for a plurality of device operations with respect to defects occurred during a fabrication period, a higher WOE score indicating a higher correlation between a defect and a device operation; and rank the plurality of WOE scores to obtain a list of selected device operations highly correlated with the defects occurred during the fabrication period, device operations in the list of selected device operations having a WOE score greater than a first threshold score; wherein a respective one of the plurality of device operations is a respective device defined by a respective operation site at which the respective device perform a respective operation.

Optionally, the memory further stores computer-executable instructions for controlling the one or more processors to obtain candidate contact areas of a plurality of contact devices, wherein a respective one of the plurality of contact devices is a respective device having a contact, in a respective chamber, with an intermediate product during the fabrication period, and a respective candidate contact area comprises a respective theoretical contact area and a respective margin area surrounding the respective theoretical contact area; obtain coordinates respectively of defect points during the fabrication period; select a plurality of defect contact areas from the candidate contact areas, a respective one of the plurality of defect contact areas enclosing at least one of the defect point coordinates; and obtain a list of selected contact devices, wherein a respective selected contact device is a respective contact device having a contact with an intermediate product in a respective defect contact area.

Optionally, the memory further stores computer-executable instructions for controlling the one or more processors to obtain one or more candidate defective devices based on the list of selected device operations highly correlated with the defects and the list of selected contact devices; wherein a respective one of the one or more candidate defective devices is a device in the list of selected contact devices and also a device in the list of selected device operations.

In another aspect, the present disclosure provides a computer-program product, comprising a non-transitory tangible computer-readable medium having computer-readable instructions thereon, the computer-readable instructions being executable by a processor to cause the processor to perform calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score; wherein a respective one of the plurality of device operations is a respective device defined by a respective operation site at which the respective device perform a respective operation.

Optionally, the computer-readable instructions are executable by a processor to further cause the processor to perform obtaining candidate contact areas of a plurality of contact devices, wherein a respective one of the plurality of contact devices is a respective device having a contact, in a respective chamber, with an intermediate product during the fabrication period, and a respective candidate contact area comprises a respective theoretical contact area and a respective margin area surrounding the respective theoretical contact area; obtaining coordinates respectively of defect points during the fabrication period; selecting a plurality of defect contact areas from the candidate contact areas, a respective one of the plurality of defect contact areas enclosing at least one of the defect point coordinates; and obtaining a list of selected contact devices, wherein a respective selected contact device is a respective contact device having a contact with an intermediate product in a respective defect contact area.

Optionally, the computer-readable instructions are executable by a processor to further cause the processor to perform obtaining one or more candidate defective devices based on the list of selected device operations highly correlated with the defects and the list of selected contact devices; wherein a respective one of the one or more candidate detective devices is a device in the list of selected contact devices and also a device in the list of selected device operations.

In another aspect, the present disclosure provides an intelligent defect analysis system, comprising a distributed computing system comprising one or more networked computers configured to execute in parallel to perform at least one common task; one or more computer readable storage mediums storing instructions that, when executed by the distributed computing system, cause the distributed computing system to execute software modules; wherein the software modules comprise a data management platform configured to intelligently extract, transform, or load raw data from a plurality of data sources into a managed data, wherein the raw data and the managed data comprise defect information, and the managed data is stored in a distributed manner; an analyzer configured to perform defect analysis upon receiving a task request, the analyzer comprising and a plurality of algorithm servers configured to obtain the managed data from the data management platform and perform algorithm analysis on the managed data to derive a result data on underlying reasons for defects; and a data visualization and interaction interface configured to generate the task requests and display the result data; wherein one or more of the plurality of algorithm servers is configured to perform the computer-implemented method described herein.

In another aspect, the present disclosure provides a computer-implemented method of evaluating likelihood of defect occurrence, comprising obtaining original data on defects occurred during a fabrication period; pre-processing the original data to obtain pre-processed data; extracting features from the pre-processed data to obtain extracted features; selecting main features from the extracted features; inputting the main features into a predictive model; and evaluating likelihood of defect occurrence; wherein extracting features from the pre-processed data comprises performing at least one of time domain analysis and frequency domain analysis on the pre-processed data.

Optionally, the time domain analysis extracts statistics information of the pre-processed data.

Optionally, the frequency domain analysis converts time domain information obtained in the time domain analysis into frequency domain information.

Optionally, selecting main features from the extracted features comprises performing principal component analysis on the extracted features.

Optionally, pre-processing the original data comprises excluding a first portion of the original data, in which equal to or greater than a threshold percentage of values are missing, from the pre-processed data; and for a second portion of the original data, in which less than the threshold percentage of values are missing, providing interpolated values for missing values.

Optionally, the predictive model is trained by obtaining training original data on defects occurred during a training fabrication period; pre-processing the training original data to obtain pre-processed training data; extracting features from the pre-processed training data to obtain extracted training features; selecting main training features from the extracted training features; and tuning parameters of an initial model using the extracted training features to obtain the predictive model for defect prediction; wherein extracting training features from the pre-processed training data comprises performing at least one of time domain analysis and frequency domain analysis on the pre-processed training data.

Optionally, the initial model is an eXtreme Gradient Boosting (XGBoost) model.

Optionally, tuning parameters of the initial model comprises evaluating a F measure according to Equation (1):

$$\frac{1}{F_\beta} = \frac{1}{1+\beta^2}\left(\frac{1}{P} + \frac{\beta^2}{R}\right);$$

wherein $F\beta$ stands for a harmonic mean of precision and recall, P stands for precision, R stands for recall, $\beta$ stands for a parameter that controls a balance between P and R.

In another aspect, the present disclosure provides an intelligent defect analysis system, comprising a distributed computing system comprising one or more networked computers configured to execute in parallel to perform at least one common task; one or more computer readable storage mediums storing instructions that, when executed by the distributed computing system, cause the distributed computing system to execute software modules; wherein the software modules comprise a data manager configured to store data, and intelligently extract, transform, or load the data; a query engine connected to the data manager and configured to query the data directly from the data manager; an analyzer connected to the query engine and configured to perform defect analysis upon received a task request, the analyzer comprising a plurality of business servers and a plurality of algorithm servers, the plurality of algorithm servers configured to query the data directly from the data manager; and a data visualization and interaction interface configured to generate the task requests; wherein one or more of the plurality of algorithm servers is configured to perform the computer-implemented method of described herein.

BRIEF DESCRIPTION OF THE FIGURES

The following drawings are merely examples for illustrative purposes according to various disclosed embodiments and are not intended to limit the scope of the present invention.

FIG. 2 illustrates a computer-implemented method for defect analysis in some embodiments according to the present disclosure.

FIG. 3 illustrates a computer-implemented method for defect analysis in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The manufacturing of display panels, especially organic light emitting diode display panels, involves a highly complex and integrated process, involving numerous processes, technologies, and equipment. Defects occurring in this integrated process is difficult to trace. For example, engineers may have to rely on manual data sorting to analyze the root cause of defects based on experience.

Figure 1:
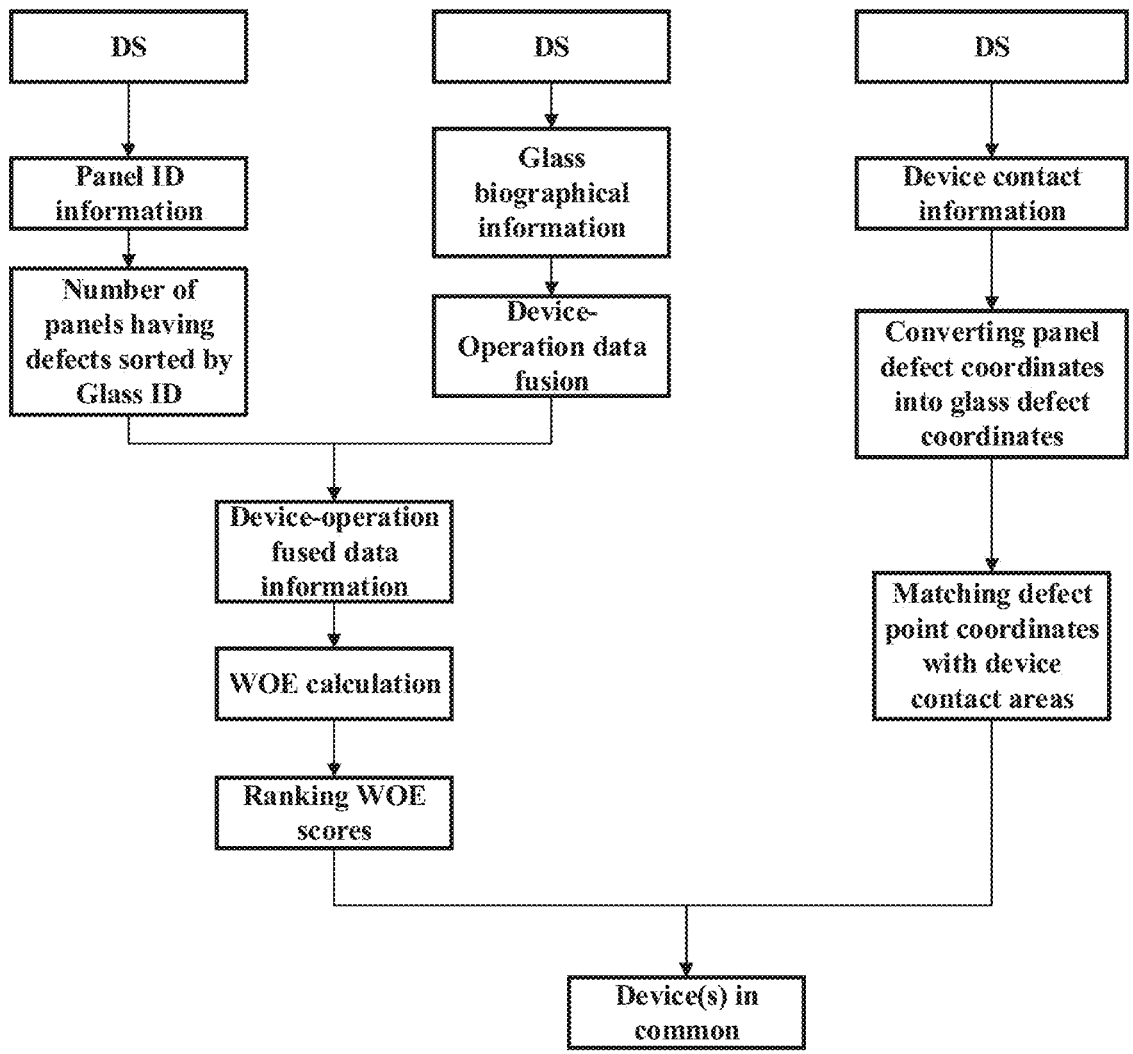
FIG. 1 illustrates a computer-implemented method for defect analysis in some embodiments according to the present disclosure.

Accordingly, the present disclosure provides, inter alia, a computer-implemented method for defect analysis, a computer-implemented method of evaluating likelihood of defect occurrence, an apparatus for defect analysis, a computer-program product, and intelligent defect analysis system that substantially obviate one or more of the problems due to limitations and disadvantages of the related art. In one aspect, the present disclosure provides a computer-implemented method for defect analysis. In some embodiments, the computer-implemented method for defect analysis includes calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score. Optionally, a respective one of the plurality of device operations is a respective device defined by a respective operation site at which the respective device perform a respective operation, FIG. 1 illustrates a computer-implemented method for defect analysis in some embodiments according to the present disclosure. Referring to FIG. 1, the method in some embodiments includes collecting business data into a plurality of data sources DS. Examples of data sources includes various business systems, including, for example, yield management system (YMS), fault detection and classification (FDC) system, Manufacturing Data Warehouse system (MDW), and manufacturing execution system (MES). In one example, the method includes obtaining panel defect information during a fabrication period (e.g., a recurring period for automatic detection, or a period having high defect occurrence frequency). The defect information is detected in panels, which is cut from substrate (also referred to as "glass" in the present disclosure). The panel and the substrate (or glass) may use different coordinate systems. The panel defect information includes, for example, panel ID information associated with coordinates of the defect points. Table 1 shows an example of panel ID information obtained from the yield management system.

Table 1 shows an example of panel ID information obtained from the yield management system.

| panel ID |
|---|
| Y8CP43925109L |
| Y91PA0115109L |
| Y91PA0119109L |
| Y91PA2622109L |
| Y91PA2626109L |
| Y91PA2627109L |
| Y91PB2316109L |
| Y91PB2322109L |
| Y91PB2330109L |
| . . . |

In another example, the method includes obtaining glass biographical information during the fabrication period. The biographical information is recorded in glass (or "substrate"), which is cut into individual panels. The defect points are detected in panels rather than in glass. Table 2 shows an example of glass biographical information obtained from the Manufacturing Data Warehouse system.

Table 2 shows an example of glass biographical information obtained from the Manufacturing Data Warehouse system.

| glass ID | Time Stamp | Event | Factory | Operation Site | Device |
|---|---|---|---|---|---|
| Y91PA2626 | Jan. 11, 2019 16:58:57 | TrackIn | A2 | 10100 | A2P01400 |
| Y91PA2626 | Jan. 11, 2019 17:25:42 | COMINMODULE | A2 | 10100 | A2P01400 |
| Y91PA2626 | Jan. 11, 2019 17:30:42 | COMOUTMODULE | A2 | 10100 | A2P01400 |
| Y91PA2626 | Jan. 11, 2019 17:31:01 | COMINCST | A2 | 10100 | A2P01400 |
| Y91PA2626 | Jan. 11, 2019 17:35:16 | TrackOut | A2 | 10100 | A2P01400 |
| Y91PA2626 | Jan. 11, 2019 17:50:46 | TrackIn | A2 | 10103 | A2A01A00 |
| Y91PA2626 | Jan. 11, 2019 18:08:36 | TrackOut | A2 | 10103 | A2A01A00 |
| Y91PA2626 | Jan. 12, 2019 01:59:31 | TrackIn | A2 | 10300 | A2P02200 |
| Y91PA2626 | Jan. 12, 2019 02:05:20 | COMINMODULE | A2 | 10300 | A2P02200 |
| Y91PA2626 | Jan. 12, 2019 02:39:03 | COMOUTMODULE | A2 | 10300 | A2P02200 |
| Y91PA2626 | Jan. 12, 2019 02:39:03 | COMINCST | A2 | 10300 | A2P02200 |
| Y91PA2626 | Jan. 12, 2019 03:00:50 | TrackOut | A2 | 10300 | A2P02200 |
| Y91PA2626 | Jan. 12, 2019 03:50:43 | TrackIn | A2 | 10303 | A2A01600 |
| Y91PA2626 | Jan. 12, 2019 03:57:31 | Hold | A2 | 10303 | A2A01600 |
| Y91PA2626 | Jan. 12, 2019 04:37:16 | Release | A2 | 10303 | A2A01600 |
| Y91PA2626 | Jan. 12, 2019 04:37:19 | TrackOut | A2 | 10303 | A2A01600 |
| ... | ... | ... | ... | ... | ... |

In another example, the method includes obtaining device contact information during the fabrication period. The device contact information is recorded in glass (or "substrate"), which is cut into individual panels. Table 3 shows an example of device contact information obtained from the yield management system.

Table 3 shows an example of glass biographical information obtained from the yield management system.

| Device | Chamber | Contact Object | Serial Number | Contact Type | X1 | Y1 | X2 | Y2 |
|---|---|---|---|---|---|---|---|---|
| A2P01400 | #104 Slot Buffer | Pin | 1 | 1 | −900.0 | 700.0 | 0.0 | 0.0 |
| A2P01400 | #104 Slot Buffer | Pin | 2 | 1 | −700.0 | 700.0 | 0.0 | 0.0 |
| A2P01400 | #104 Slot Buffer | Pin | 3 | 1 | −500.0 | 700.0 | 0.0 | 0.0 |
| A2P01400 | #104 Slot Buffer | Pin | 4 | 1 | −300.0 | 700.0 | 0.0 | 0.0 |
| A2P01400 | #104 Slot Buffer | Pin | 5 | 1 | −100.0 | 700.0 | 0.0 | 0.0 |
| A2P01400 | #104 Slot Buffer | Pin | 6 | 1 | 100.0 | 700.0 | 0.0 | 0.0 |
| A2P01400 | #104 Slot Buffer | Pin | 7 | 1 | 300.0 | 700.0 | 0.0 | 0.0 |
| A2P01400 | #104 Slot Buffer | Pin | 8 | 1 | 500.0 | 700.0 | 0.0 | 0.0 |
| A2P01400 | #104 Slot Buffer | Pin | 9 | 1 | 700.0 | 700.0 | 0.0 | 0.0 |
| A2P01400 | #104 Slot Buffer | Pin | 10 | 1 | 900.0 | 700.0 | 0.0 | 0.0 |
| A2A01A00 | #103 Pin Up Conveyor | Roller | 1 | 2 | −925.0 | 700.0 | 925.0 | 700.0 |
| A2A01A00 | #103 Pin Up Conveyor | Roller | 2 | 2 | −925.0 | 500.0 | 925.0 | 500.0 |
| A2A01A00 | #103 Pin Up Conveyor | Roller | 3 | 2 | −925.0 | 300.0 | 925.0 | 300.0 |
| A2A01A00 | #103 Pin Up Conveyor | Roller | 4 | 2 | −925.0 | 100.0 | 925.0 | 100.0 |
| A2A01A00 | #103 Pin Up Conveyor | Roller | 5 | 2 | −925.0 | −100.0 | 925.0 | −100.0 |
| A2A01A00 | #103 Pin Up Conveyor | Roller | 6 | 2 | −925.0 | −300.0 | 925.0 | −300.0 |
| A2A01A00 | #103 Pin Up Conveyor | Roller | 7 | 2 | −925.0 | −500.0 | 925.0 | −500.0 |
| A2A01A00 | #103 PinUp Conveyor | Roller | 8 | 2 | −925.0 | −700.0 | 925.0 | −700.0 |
| A2P02200 | #120 Turn Over | Bar | 1 | 3 | −910.0 | 700.0 | 910.0 | 740.0 |
| A2P02200 | #120 Turn Over | Bar | 2 | 3 | −910.0 | 492.5 | 910.0 | 532.5 |
| A2P02200 | #120 Turn Over | Bar | 3 | 3 | −910.0 | 295.0 | 910.0 | 365.0 |
| A2P02200 | #120 Turn Over | Bar | 4 | 3 | −910.0 | 65.0 | 910.0 | 135.0 |
| A2P02200 | #120 Turn Over | Bar | 5 | 3 | −910.0 | −135.0 | 910.0 | −65.0 |
| A2P02200 | #120 Turn Over | Bar | 6 | 3 | −910.0 | −365.0 | 910.0 | −295.0 |
| A2P02200 | #120 Turn Over | Bar | 7 | 3 | −910.0 | −532.5 | 910.0 | −492.5 |
| A2P02200 | #120 Turn Over | Bar | 8 | 3 | −910.0 | −740.0 | 910.0 | −700.0 |
| A2A01600 | C2PIL150 | Alignment roller | 1 | 4 | 921.0 | −4.0 | 929.0 | 4.0 |
| A2A01600 | C2PIL150 | Alignment roller | 2 | 4 | 416.0 | 746.0 | 424.0 | 754.0 |
| A2A01600 | C2PIL150 | Alignment roller | 3 | 4 | 416.0 | −754.0 | 424.0 | −746.0 |
| A2A01600 | C2PIL150 | Alignment roller | 4 | 4 | −929.0 | −4.0 | −921.0 | 4.0 |

-continued

| Device | Chamber | Contact Object | Serial Number | Contact Type | X1 | Y1 | X2 | Y2 |
|---|---|---|---|---|---|---|---|---|
| A2A01600 | C2PIL150 | Alignment roller | 5 | 4 | −424.0 | 746.0 | −416.0 | 754.0 |
| A2A01600 | C2PIL150 | Alignment roller | 6 | 4 | −424.0 | −754.0 | −416.0 | −746.0 |

In some embodiments, the method further includes pre-processing the raw data from the plurality of data sources DS. As discussed above, the defect points are detected in panels, which is cut from glass. The yield management system contains only the defect information at panel level, however, lacks of connection with the glass biographical information. In one example, the panel ID in table 1 may be pre-processed to obtain glass ID. For example, the first nine digits in the panel ID stands for the glass ID. The panel ID information may be pre-processed to obtain defect points information in association with the glass ID, as shown in Table 4. Accordingly, as shown in FIG. 1, the method includes obtaining information on a number of panels having detects sorted by Glass ID.

TABLE 4

Panels having defects and panels free of defect sorted by glass ID.

| glass ID | Number of panels having defects | Number of panels free of defect |
|---|---|---|
| Y8CP43925 | 1 | 195 |
| Y91PA0115 | 1 | 195 |
| Y91PA0119 | 1 | 195 |
| Y91PA2622 | 1 | 195 |
| Y91PA2626 | 1 | 195 |
| Y91PA2627 | 1 | 195 |
| Y91PB2316 | 1 | 195 |
| Y91PB2322 | 1 | 195 |
| Y91PB2330 | 2 | 194 |
| . . . | . . . | . . . |

The information in Table 2 includes various information including factory, operation site, and device. Information redundancy inherently exists in Table 2. Thus, in some embodiments, the method further includes performing data fusion on device and operation site to a fused data information, e.g., "device-operation", which stands for a respective device defined by a respective operation site at which the respective device perform a respective operation. The information is then sorted by time stamp, and filtered by event ("TrackOut" in Table 2), thereby obtaining device-operation information sorted by Glass ID, as shown in Table 5.

TABLE 5

Device-operation information sorted by Glass ID.

| glass ID | Time Stamp | Event | Factory | Device-operation |
|---|---|---|---|---|
| Y91PA2626 | Jan. 11, 2019 17:35:16 | TrackOut | A2 | 10100_A2P01400 |
| Y91PA2626 | Jan. 11, 2019 18:08:36 | TrackOut | A2 | 10103_A2A01A00 |
| Y91PA2626 | Jan. 12, 2019 03:00:50 | TrackOut | A2 | 10300_A2P02200 |
| Y91PA2626 | Jan. 12, 2019 04:37:19 | TrackOut | A2 | 10303_A2A01600 |
| . . . | . . . | . . . | . . . | . . . |

As discussed above, the defects points are detected under a panel coordinate system. On the other hand, the device contact information are recorded under a glass coordinate system. In some embodiments, the method further includes converting the coordinates of panel defect points under the panel coordinate system into coordinates under the glass coordinate system.

FIG. 2 illustrates a computer-implemented method for defect analysis in some embodiments according to the present disclosure. Referring to FIG. 2, the method further includes, subsequent to pre-processed the raw data, calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score. Optionally, a respective one of the plurality of device operations is a respective device defined by a respective operation site at which the respective device perform a respective operation.

In one example, based on the Glass ID, table 4 and table 5 may be consolidated. Specifically, "Number of panels having defects" information and "Nwnber of panels free of defect" information may be re-sorted with consolidated "device-operation" information. Table 6 shows an example of "Number of panels having defects" information and "Number of panels free of defect" information by "device-operation".

Table 6 shows an example of "Number of panels having defects" information and "Number of panels free of defect" information by "device-operation".

| Device-operation | Number of panels having defects | Number of panels free of defect |
|---|---|---|
| 10001_A2PNC100 | 185 | 40855 |
| 10100_A2PVD100 | 13 | 3107 |
| 10100_A2PVD400 | 571 | 129029 |
| 10100_A2PVD600 | 40 | 7640 |

| Device-operation | Number of panels having defects | Number of panels free of defect |
|---|---|---|
| 10102__A2PDC300 | 2 | 478 |
| 10102__A2PDC500 | 1 | 239 |
| 10103__A2AOI700 | 13 | 3107 |
| 10103__A2AOI800 | 10 | 2390 |
| 10103__A2AOIA00 | 199 | 44441 |
| 10107__A2RSM100 | 179 | 39181 |
| 101R3__A2AOI700 | 7 | 1673 |
| 101R3__A2AOI800 | 12 | 2628 |
| 101R3__A2AOIA00 | 10 | 2390 |
| 10300__A2PHT200 | 624 | 139776 |
| ... | ... | ... |

As shown in Table 6, a majority of samples are panels free of defect, thus it is necessary to perform a correlation analysis on the data obtained in Table 6. In one example, the correlation analysis is performed using a weight-of-evidence method. In another example, a weight-of-evidence score for each "device-operation" may be calculated according to an equation:

$$WOE_i = \ln\left(\frac{y_i/y_T}{n_i/n_T}\right);$$

wherein i stands for a respective device-operation, $y_i$ stands for a number of panels having defects with respect to the respective device-operation, $n_i$ stands for a number of panels free of defect with respect to the respective device-operation, $y_T$ stands for a total number of panels having defects in the data, and n-r stands for a total number of panels free of defect in the data. The device-operations are then ranked by their respective WOE scores, as shown in Table 7.

Table 7 shows a list of device-operations ranked by WOE scores.

| Ranking | Device-operation | WOE |
|---|---|---|
| 1 | 19103__A2AOI500 | 0.76986168 |
| 2 | 162R3__A2AOI100 | 0.635129086 |
| 3 | 14202__A2PDC300 | 0.635129086 |
| 4 | 16315__A2CDC300 | 0.583415711 |
| 5 | 11313__A2AOI600 | 0.410306273 |
| 6 | 16305__A2CDC100 | 0.292382166 |
| 7 | 1A3R3__A2AOI600 | 0.275936306 |
| 8 | 163R3__A2AOI500 | 0.249466605 |
| 9 | 1A1R3__A2AOI200 | 0.226866773 |
| 10 | 11305__A2CDC200 | 0.226866773 |

FIG. 3 illustrates a computer-implemented method for defect analysis in some embodiments according to the present disclosure. Referring to FIG. 3, the method in some embodiments further includes obtaining candidate contact areas of a plurality of contact devices, wherein a respective one of the plurality of contact devices is a respective device having a contact, in a respective chamber, with an intermediate substrate during the fabrication period, and a respective candidate contact area comprises a respective theoretical contact area and a respective margin area surrounding the respective theoretical contact area; obtaining coordinates respectively of defect points during the fabrication period; selecting a plurality of defect contact areas from the candidate contact areas, a respective one of the plurality of defect contact areas enclosing at least one of the detect point coordinates; and obtaining a list of selected contact devices, wherein a respective selected contact device is a respective contact device having a contact with an intermediate substrate in a respective defect contact area.

Figure 4A:
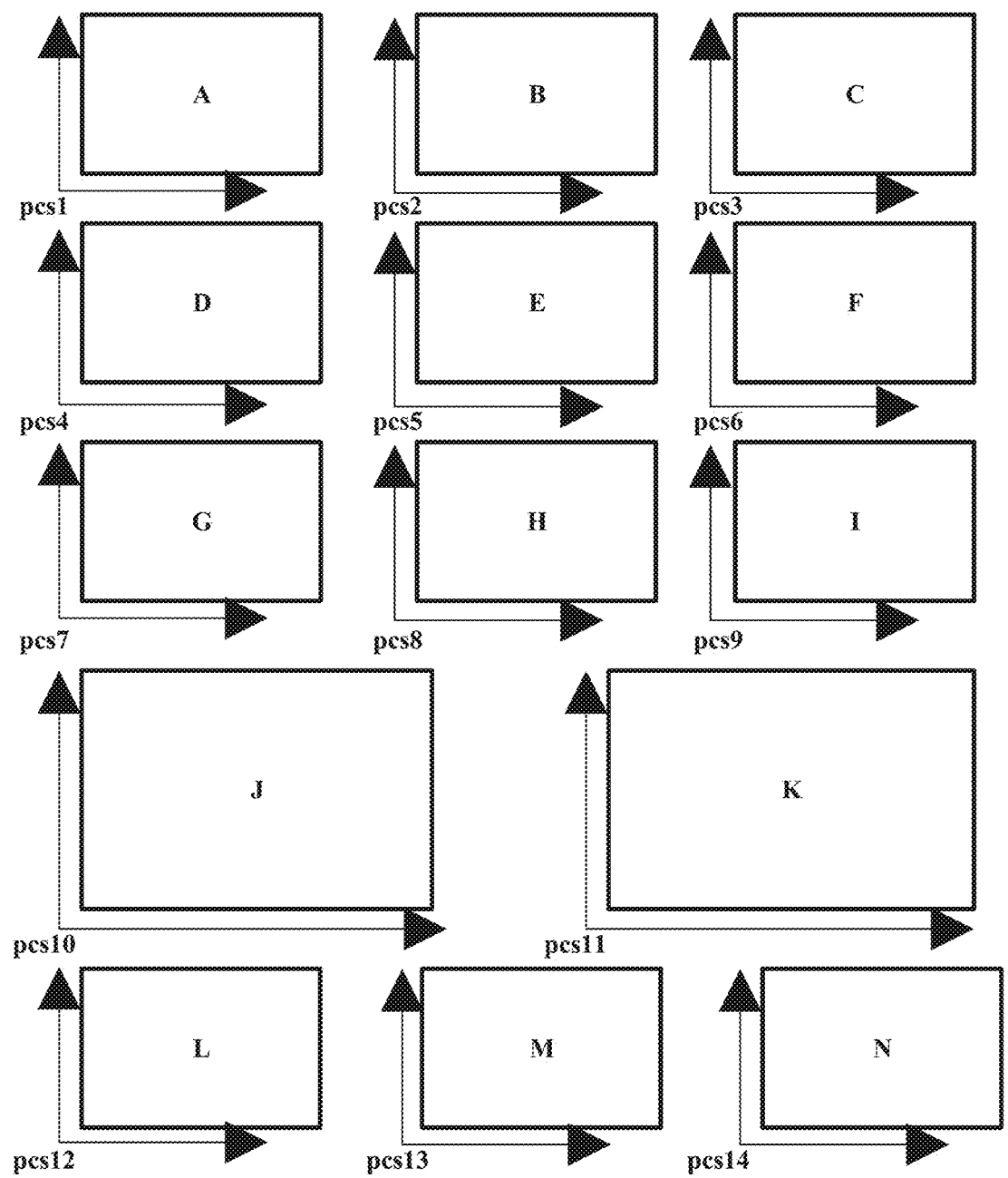
FIG. 4A and FIG. 4B illustrate a conversion process from individual panel coordinate systems into a uniform substrate coordinate system.
Figure 4B:
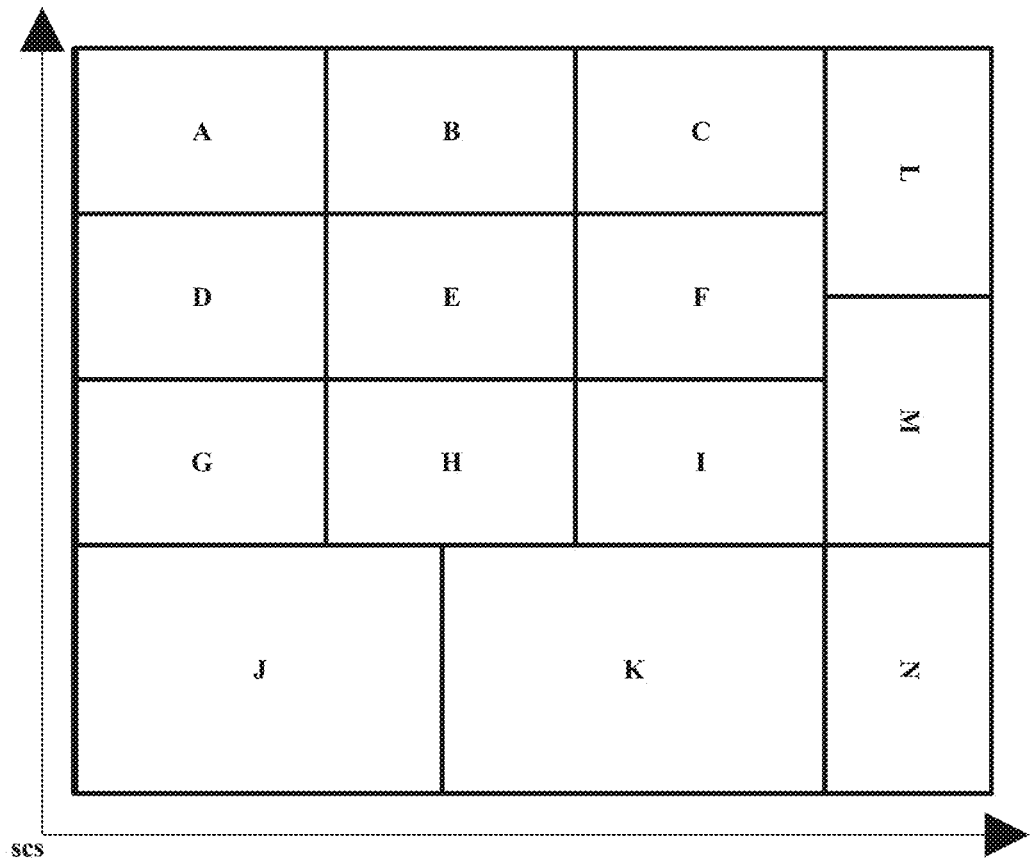

Referring to FIG. 1, the method in some embodiments, subsequent to obtaining coordinates respectively of defect points during the fabrication period, converting the coordinates in the panel defect coordinate system into coordinates in the glass defect coordinate system. FIG. 4A and FIG. 4B illustrate a conversion process from individual panel coordinate systems into a uniform substrate coordinate system. Referring to FIG. 4A, panel defect points in the plurality of panel defect images (A to N) have panel coordinates assigned according to respective panel coordinate systems (pcs1 to pcs14). For example, panel defect points in a panel detect image A are assigned panel coordinates according to a first panel coordinate system pcs1, panel defect points in a panel defect image B are assigned panel coordinates according to a second panel coordinate system pcs2, panel defect points in a panel defect image C are assigned panel coordinates according to a third panel coordinate system pcs3, and so on. Because the panels are cut from a substrate during the manufacturing process, coordinates in the individual panel coordinate systems may be converted into a unified substrate coordinate system. In one example, the defect analysis is for a same type of product (e.g., an organic light emitting diode display panel), thus multiple substrates used for producing panels have a same substrate coordinate system. Referring to FIG. 4B, the coordinates of the panel defect points in individual panel coordinate systems are converted into the coordinates of the defect points in the substrate coordinate system scs.

In one example, the computer-implemented method further includes establishing a mapping relationship between the coordinates in the panel coordinate system and the coordinates in the substrate coordinate system. In another example, the mapping relationship may be expressed as:

$$M_{3\times 3} = \begin{bmatrix} R_{2\times 2} & T_{2\times 1} \\ 0 & 1 \end{bmatrix};$$

wherein $$R_{2\times 2} = \begin{bmatrix} \cos\theta & -\sin\theta \\ \sin\theta & \cos\theta \end{bmatrix}$$

which is a rotation matrix; and $$T_{2\times 1} = \begin{bmatrix} t_x \\ t_y \end{bmatrix}$$

which is a translation matrix.

Optionally, the coordinate conversion may be expressed as:

$$\begin{bmatrix} X_i \\ Y_i \\ 1 \end{bmatrix} = M_{3\times 3} \begin{bmatrix} x_i \\ y_i \\ 1 \end{bmatrix};$$

wherein $X_i$ and $Y_i$ stands for the coordinates in the substrate coordinate system; and $x_i$ and $y_i$ stands for the coordinates in the panel coordinate system.

Various devices have various different contact types with a substrate during the fabrication period. Examples of contact types include point contact, linear contact, circular area contact, and rectangular area contact.

Figure 5:
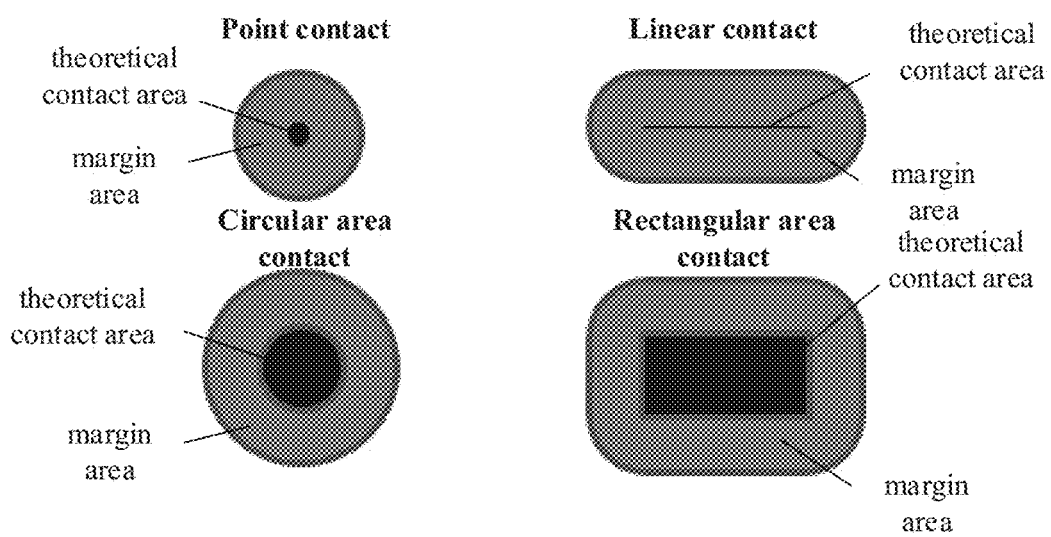
FIG. 5 illustrates several candidate contact areas in some embodiments according to the present disclosure.

In actual manufacturing process, the actual contact position(s) may deviate from the theoretical contact position(s) by a certain degree. Thus, in some embodiments, the candidate contact areas of the contact devices should be enlarged correspondingly, considering the deviation in the actual manufacturing process. In some embodiments, a respective candidate contact area comprises a respective theoretical contact area and a respective margin area surrounding the respective theoretical contact area. FIG. 5 illustrates several candidate contact areas in some embodiments according to the present disclosure.

Referring to FIG. 1, once the candidate contact areas are calculated, the defect point coordinates in the glass coordinate system are matched with the candidate contact areas. Accordingly, a plurality of defect contact areas may be selected from the candidate contact areas, a respective one of the plurality of defect contact areas enclosing at least one of the defect point coordinates. A list of selected contact devices may be obtained, wherein a respective selected contact device is a respective contact device having a contact with an intermediate substrate in a respective defect contact area. Table 8 shows an example of a list of selected contact devices.

Table 8 shows an example of a list of selected contact devices having contacts with an intermediate substrate in defect contact areas.

device operations highly correlated with the defects and the list of selected contact devices. A respective one of the one or more candidate defective devices is a device in the list of selected contact devices and also a device in the list of selected device operations.

In another aspect, the present disclosure provides an apparatus for defect analysis. In some embodiments, the apparatus for defect analysis includes a memory; and one or more processors. The memory and the one or more processors are connected with each other. In some embodiments, the memory stores computer-executable instructions for controlling the one or more processors to calculate a plurality of weight-of-evidence (WOE) scores respectively for a plurality of device operations with respect to defects occurred during a fabrication period, a higher WOE score indicating a higher correlation between a defect and a device operation; and rank the plurality of WOE scores to obtain a list of selected device operations highly correlated with the defects occurred during the fabrication period, device operations in the list of selected device operations having a WOE score greater than a first threshold score. A respective one of the plurality of device operations is a respective device defined by a respective operation site at which the respective device perform a respective operation.

In some embodiments, the memory further stores computer-executable instructions for controlling the one or more processors to obtain candidate contact areas of a plurality of contact devices, wherein a respective one of the plurality of contact devices is a respective device having a contact, in a respective chamber, with an intermediate substrate during

| Device | Chamber | Contact object | Serial Number | Contact type | X1 | Y1 | X2 | Y2 |
|---|---|---|---|---|---|---|---|---|
| Exposure | Exposure Stage | Tray | 1 | 3 | −925 | −545 | 925 | −539 |
| Exposure | Exposure Stage | Tray | 2 | 3 | −925 | −334 | 925 | −328 |
| Exposure | Exposure Stage | Tray | 3 | 3 | −925 | −123 | 925 | −117 |
| Exposure | Exposure Stage | Tray | 8 | 3 | −537 | −750 | −531 | 750 |
| Exposure | Exposure Stage | Tray | 9 | 3 | −359 | −750 | −353 | 750 |
| Exposure | Exposure Stage | Plate Holder | 15 | 3 | −526.5 | −745.5 | −363.5 | −549.5 |
| TEL | S/A | PIN | 42 | 3 | −750 | −575 | 0 | 0 |
| TEL | S/A | PIN | 56 | 3 | −750 | −615 | 0 | 0 |
| A2MIC100/200 | VACUUM | GRIPPER | 2 | 3 | −512.5 | −750 | −312.5 | −742 |
| WET300-400 | AP conveyor (2F) | Transfer roller | 11 | 3 | 925 | −749 | −925 | −744 |
| WET300-400 | Entrance conveyor (1F) | Transfer roller | 6 | 3 | 925 | −750 | −925 | −745 |
| WET300-400 | Air knife | Transfer roller | 15 | 3 | 925 | −750 | −925 | −745 |
| WET300-400 | Air knife | Upper roller | 16 | 3 | 925 | −750 | −925 | −745 |
| PTNG5.5 | VACUUM | GRIPPER | 4 | 3 | −324 | −750 | −474 | −742 |
| PI Review | C2PIL1B0 | Air floatation module | 24 | 3 | −457 | −745 | −7 | −651 |
| Seal Oven | Bar | Bar | 4 | 3 | −925 | 85.5 | 925 | 94.5 |
| Seal Oven | Bar | Bar | 5 | 3 | −925 | −94.5 | 925 | −85.5 |
| Seal Oven | Bar | Bar | 6 | 3 | −925 | 294.5 | 925 | 285.5 |
| Seal Oven | Bar | Bar | 7 | 3 | −925 | 494.5 | 925 | 485.5 |
| Seal Oven | Bar | Bar | 8 | 3 | −925 | 694.5 | 925 | 685.5 |

Referring to FIG. 1, the method in some embodiments further includes finding device(s) in common from the WOE ranking list and the selected contact devices list. In some embodiments, the method includes obtaining one or more candidate defective devices based on the list of selected the fabrication period, and a respective candidate contact area comprises a respective theoretical contact area and a respective margin area surrounding the respective theoretical contact area; obtain coordinates respectively of defect points during the fabrication period; select a plurality of defect contact areas from the candidate contact areas, a respective one of the plurality of defect contact areas enclosing at least one of the detect point coordinates; and obtain a list of selected contact devices, wherein a respective selected contact device is a respective contact device having a contact with an intermediate substrate in a respective defect contact area.

In some embodiments, the memory further stores computer-executable instructions for controlling the one or more processors to obtain one or more candidate defective devices based on the list of selected device operations highly correlated with the defects and the list of selected contact devices. A respective one of the one or more candidate defective devices is a device in the list of selected contact devices and also a device in the list of selected device operations.

Figure 6A:
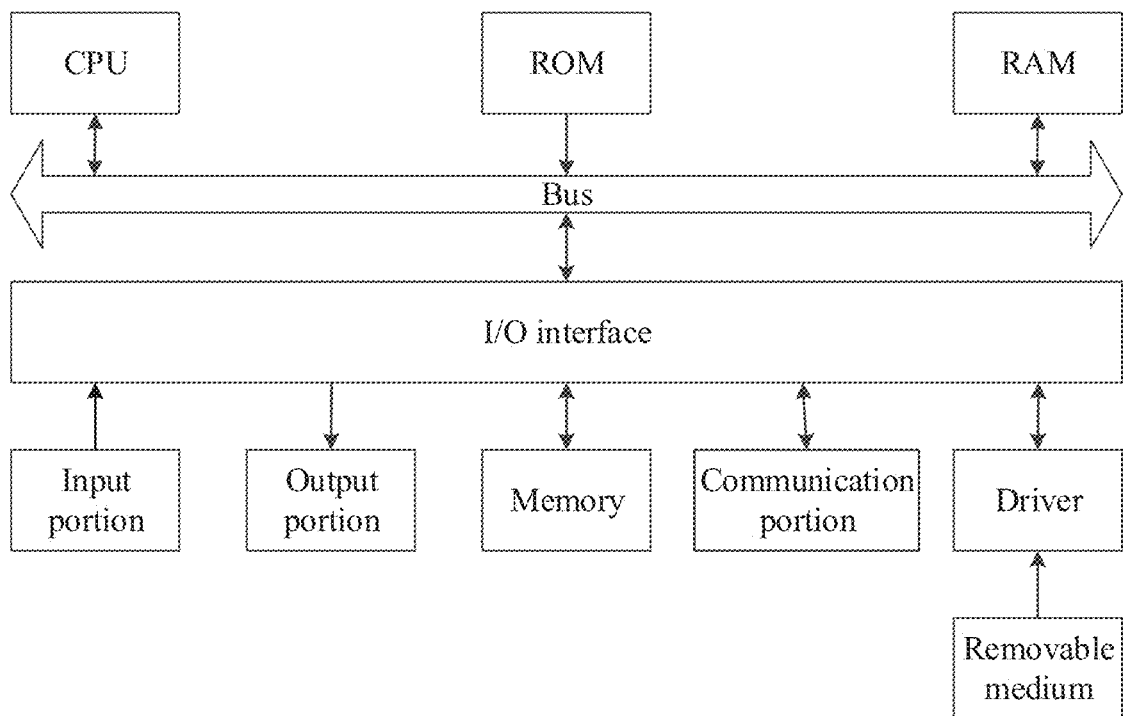
FIG. 6A is a schematic diagram of a structure of an apparatus in some embodiments according to the present disclosure.

FIG. 6A is a schematic diagram of a structure of an apparatus in some embodiments according to the present disclosure. Referring to FIG. 6A, in some embodiments, the apparatus includes the central processing unit (CPU) configured to perform actions according to the computer-executable instructions stored in a ROM or in a RAM. Optionally, data and programs required for a computer system are stored in RAM. Optionally, the CPU, the ROM, and the RAM are electrically connected to each other via bus. Optionally, an input/output interface is electrically connected to the bus.

Figure 6B:
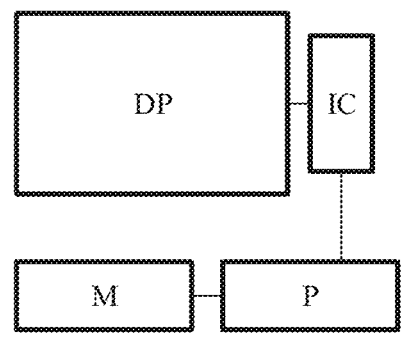
FIG. 6B is a schematic diagram illustrating the structure of an apparatus in some embodiments according to the present disclosure.

FIG. 6B is a schematic diagram illustrating the structure of an apparatus in some embodiments according to the present disclosure. Referring to FIG. 6B, in some embodiments, the apparatus includes a display panel DP; an integrated circuit IC connected to the display panel DP; a memory M; and one or more processors P. The memory M and the one or more processors P are connected with each other. In some embodiments, the memory M stores computer-executable instructions for controlling the one or more processors P to execute method steps described herein.

In another aspect, the present disclosure provides a computer-program product comprising a non-transitory tangible computer-readable medium having computer-readable instructions thereon. In some embodiments, the computer-readable instructions being executable by a processor to cause the processor to perform calculating a plurality of weight-of-evidence (WOE) scores respectively for a plurality of device operations with respect to defects occurred during a fabrication period, a higher WOE score indicating a higher correlation between a defect and a device operation; and ranking the plurality of WOE scores to obtain a list of selected device operations highly correlated with the defects occurred during the fabrication period, device operations in the list of selected device operations having a WOE score greater than a first threshold score. A respective one of the plurality of device operations is a respective device defined by a respective operation site at which the respective device perform a respective operation. Optionally, weights of evidence represent variability between a percentage of defects in the respective device operation with respect to a percentage of defects in an entirety of the plurality of device operations.

In some embodiments, the computer-readable instructions are further executable by a processor to cause the processor to perform obtaining candidate contact areas of a plurality of contact devices, wherein a respective one of the plurality of contact devices is a respective device having a contact, in a respective chamber, with an intermediate substrate during the fabrication period, and a respective candidate contact area comprises a respective theoretical contact area and a respective margin area surrounding the respective theoretical contact area; obtaining coordinates respectively of defect points during the fabrication period; selecting a plurality of defect contact areas from the candidate contact areas, a respective one of the plurality of defect contact areas enclosing at least one of the defect point coordinates; and obtaining a list of selected contact devices, wherein a respective selected contact device is a respective contact device having a contact with an intermediate substrate in a respective defect contact area.

In some embodiments, the computer-readable instructions are further executable by a processor to cause the processor to perform obtaining one or more candidate defective devices based on the list of selected device operations highly correlated with the defects and the list of selected contact devices. A respective one of the one or more candidate defective devices is a device in the list of selected contact devices and also a device in the list of selected device operations.

In another aspect, the present disclosure further provides a computer-implemented method of evaluating likelihood of defect occurrence. In some embodiments, the computer-implemented method of evaluating likelihood of detect occurrence includes obtaining original data on defects occurred during a fabrication period; pre-processing the original data to obtain pre-processed data; extracting features from the pre-processed data to obtain extracted features; selecting main features from the extracted features; tuning parameters of an initial model using the extracted features to obtain a predictive model for defect evaluation; inputting the main features into the predictive model; and evaluating likelihood of defect occurrence. Optionally, extracting features from the pre-processed data comprises performing at least one of time domain analysis and frequency domain analysis on the pre-processed data.

In one example, the method includes obtaining data stored in a plurality of data sources such as a fault detection and classification system. The data is then filtered by, for example, "fabrication process," "product type," and "product model." The original data is pre-processed by, for example, line conversion and field splicing, to generate a table containing parameters during the fabrication period. An example is shown in Table 9.

TABLE 9

| Parameters of panel production. | | | | | |
| --- | --- | --- | --- | --- | --- |
| glass_id | Device | Machine | Chamber | Parameter name | Parameter value |
| A9B0014A1 | ABC01 | BCBL | BL01 | L1_Energy | [1017.00, 1017.00, 1017.00, . . . , 1017.00] |
| A9B0014A1 | ABC01 | BCBL | BL01 | L1_Water_Temp | [14.90, 14.90, 14.90, . . . , 14.90] |
| A9B0014A1 | ABC01 | BCBL | BL01 | L1_Water_Press | [4.90, 4.90, 4.90, . . . , 4.90] |
| A9B0022A5 | ABC02 | BCBL | BL01 | L2_Energy | [995.00, 995.00, 994.00, . . . , 995.00] |
| A9B0022A5 | ABC02 | BCBL | BL01 | L2_Water_Temp | [14.90, 14.90, 14.90, . . . , 14.90] |
| A9B0022A5 | ABC02 | BCBL | BL01 | L2_Water_Press | [4.90, 4.90, 4.90, . . . , 4.90] |
| . . . | . . . | . . . | . . . | . . . | . . . |

In another example, the method further includes obtaining defect point information from the yield management system. For example, the data may be sorted by the type of defects. Table 10 shows an example of the sorted table.

Table 10 shows an example of defect information obtained from a data source.

| glass_id | Type of defect |
|---|---|
| A9B0014A1 | ACTE |
| A9B0014A2 | ACTE |
| A9B0014A3 | ACTE |
| A9B0014A4 | ACTE |
| A9B0014A5 | ACTE |

Figure 7:
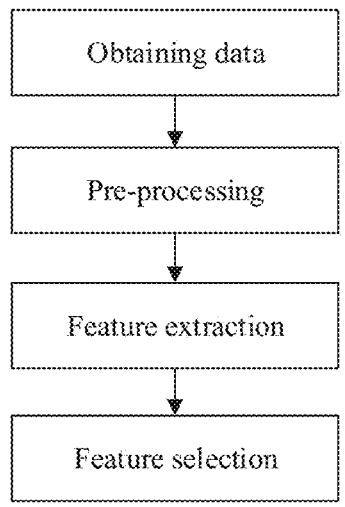
FIG. 7 illustrates a computer-implemented method of evaluating likelihood of defect occurrence in some embodiments according to the present disclosure.

FIG. 7 illustrates a computer-implemented method of evaluating likelihood of defect occurrence in some embodiments according to the present disclosure. Referring to FIG. 7, subsequent to obtaining data, the method further includes at least one of a pre-processing step, a feature extraction step and a feature selection step.

In one example, the pre-processing step includes a character-type data pre-processing to convert character-type data into a format that can be processed by various algorithms of the present method. For example, in Table 9, the device "ABC01" and the device "ABC02" are devices that parallelly performing a same process based on business knowledge. The device "ABC01" and the device "ABC02" are associated with exact same set of parameter names. Accordingly, it is necessary to provide a code for the devices (e.g., 0 for ABC01 and 1 for ABC02).

In another example, machine "BCBL" and machine "HCLN" are machines performing sequential processes, based on business knowledge. Thus, parameter names associated with machine "BCBL" are completely different from parameter names associated with machine "HCLN". Accordingly, the "machine" characters are not necessary, and can be removed prior to subsequent analysis steps. Similarly, the "chamber" characters are also not necessary, and can be removed prior to subsequent analysis steps. Basically, based on "glass ID," "device," and "parameter name," a unique value can be ascertained for each parameter name. Table 11 shows an example of pre-processed data.

Table 11 shows an example of pre-processed data.

| glass_id | Device | Parameter name | Parameter value |
|---|---|---|---|
| A9B0014A1 | 0 | L1_Energy | [1017.00, 1017.00, 1017.00, . . . , 1017.00] |
| A9B0014A1 | 0 | L1_Water_Temp | [14.90, 14.90, 14.90, . . . , 14.90] |
| A9B0014A1 | 0 | L1_Water_Press | [4.90, 4.90, 4.90, . . . , 4.90] |
| A9B0022A5 | 1 | L2_Energy | [995.00, 995.00, 994.00, . . . , 995.00] |
| A9B0022A5 | 1 | L2_Water_Temp | [14.90, 14.90, 14.90, . . . , 14.90] |
| A9B0022A5 | 1 | L2_Water_Press | [4.90, 4.90, 4.90, . . . , 4.90] |
| . . . | . . . | . . . | . . . |

The data may be further processed prior to feature extraction. In some embodiments, the pre-processing step further includes excluding a first portion of the original data, in which equal to or greater than a threshold percentage of values are missing, from the pre-processed data; and for a second portion of the original data, in which less than the threshold percentage of values are missing, providing interpolated values for missing values. For example, when a sample data has equal to or greater than 30% (e.g., equal to or greater than 35%, equal to or greater than 40%, or equal to or greater than 45%) of values missing, it may be deemed as invalid data, and may be excluded from feature extraction and subsequent analysis steps. In another example, a sample data has less than 30% (e.g., less than 35%, less than 40%, or less than 45%) values missing, thus is preserved for subsequent feature extraction and other processes. The missing values may be provided using interpolated values, for example, calculated by a mean interpolation method.

Figure 8:
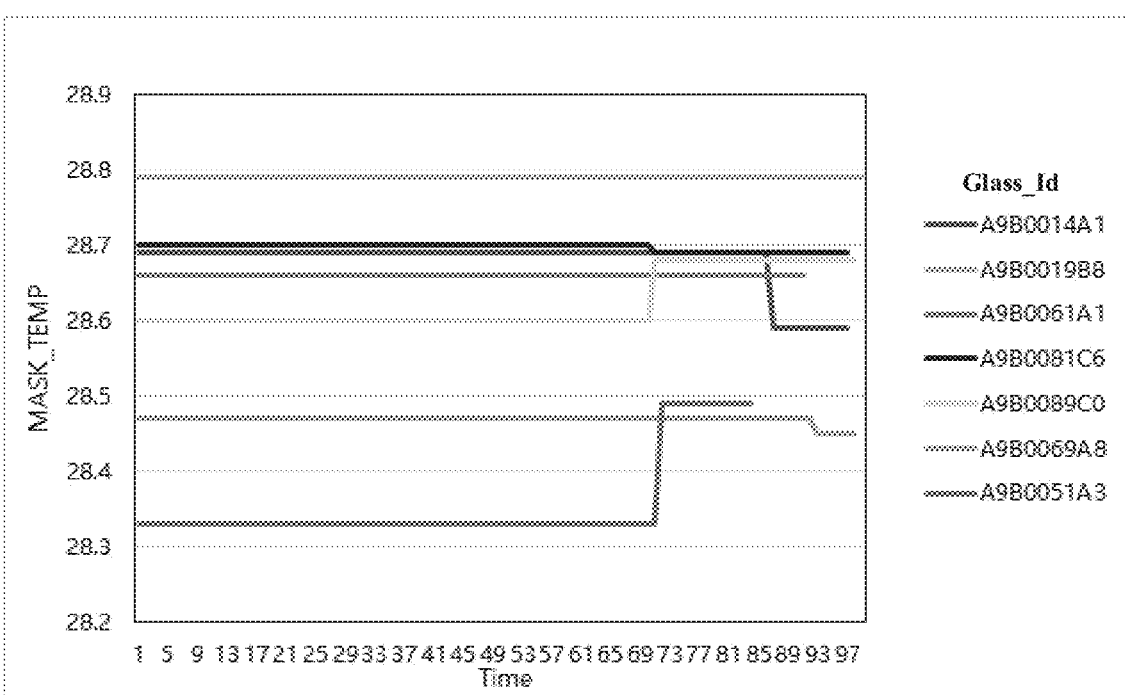
FIG. 8 shows parameter values of a parameter name "MASK_TEMP" from several glasses in one example of the present disclosure.

FIG. 8 shows parameter values of a parameter name "MASK_TEMP" from several glasses in one example of the present disclosure. Referring to FIG. 8, the parameter values recorded for each glass includes fragments of data of different lengths in the time series. When different glasses are processed in the same equipment or chamber (i.e., glasses undergo the same processing process), the number of data points recorded by the sensor is inconsistent, and the time at which the parameters actually change may also be different from the theoretical time. Data with such characteristics are not suitable for direct use as input to machine learning algorithms. Simply truncating or complementing the data into fragments of equal length does not help either.

Accordingly, referring to FIG. 7, the present method includes a feature extraction step to extract features from the pre-processed data. In some embodiments, the feature extraction step includes at least one of time domain analysis and frequency domain analysis on the pre-processed data. Optionally, extracting features from the pre-processed data includes performing the time domain analysis on the pre-processed data. Optionally, the time domain analysis extracts statistics information of the pre-processed data comprising one or more of count, mean value, maximum value, minimum value, range, variance, bias, kurtosis, and percentile. Optionally, extracting features from the pre-processed data further includes performing the frequency domain analysis on the pre-processed data. Optionally, the frequency domain analysis converts time domain information obtained in the time domain analysis into frequency domain information comprising one or more of power spectrum, information entropy, and signal-to-noise ratio. Table 12 shows an example of results of feature extraction.

Table 12 shows an example of results of feature extraction.

| glass_id | L1_Water_Temp_Max | L1_Water_Temp_Min | . . . | L2_Water_Temp_Mean | . . . |
|---|---|---|---|---|---|
| A9B0014A1 | 14.9 | 14.9 | . . . | 14.9 | . . . |
| A9B0014A2 | 14.9 | 14.9 | . . . | 14.9 | . . . |
| A9B0014A3 | 14.9 | 14.8 | . . . | 14.8 | . . . |

-continued

| glass_id | L1_Water_Temp_Max | L1_Water_Temp_Min | ... | L2_Water_Temp_Mean | ... |
|---|---|---|---|---|---|
| A9B0014A4 | 14.9 | 14.7 | ... | 14.7 | ... |
| A9B0014A5 | 14.9 | 14.7 | ... | 14.7 | ... |
| A9B0014B1 | 14.9 | 14.9 | ... | 14.9 | ... |
| A9B0014B2 | 14.9 | 14.9 | ... | 14.9 | ... |
| A9B0014B3 | 14.9 | 14.9 | ... | 14.9 | ... |
| A9B0014B4 | 14.9 | 14.8 | ... | 14.8 | ... |
| A9B0014B5 | 14.8 | 14.7 | ... | 14.8 | ... |

The manufacturing process for display panels is highly complex. In one example, a total number of non-duplicate parameter names is 491 at a single operation site. Thus, each glass at the operation site produces 491 different parameters. After the feature extraction step, the data dimension increases to thousands. Based on business knowledge, the devices in the same space will have more than one sensor of the same type to perform detection at the same time, resulting in a large number of features of common linearity and other redundancy problems. Accordingly, referring to FIG. 7, the present method further includes a feature selection step to reduce the data dimension. In one example, a principle component analysis method is used for selecting main features from the extracted features.

In some embodiment, the predictive model is trained by a computer-implemented training method. In some embodiments, the computer-implemented training method includes obtaining training original data on defects occurred during a training fabrication period; pre-processing the training original data to obtain pre-processed training data; extracting features from the pre-processed training data to obtain extracted training features; selecting main training features from the extracted training features; and tuning parameters of an initial model using the extracted training features to obtain the predictive model for defect prediction. Optionally, extracting training features from the pre-processed training data comprises performing at least one of time domain analysis and frequency domain analysis on the pre-processed training data, details of which are discussed in the context of the method of evaluating likelihood of defect occurrence.

Various appropriate models may be used as the initial model for the training. Examples of appropriate statistic models include an eXtreme Gradient Boosting (XGBoost) model; a random Forest (RF) model; a gradient boosted machine (GBM) model; a Generalized Linear Model (GLM) model. In some embodiments, the plurality of statistical models comprises one or more of: a univariate K-fold cross-correlated XGBoost model; a multivariate XGBoost model; a univariate K-fold cross-correlated Random Forest model; a multivariate Random Forest model; a univariate K-fold cross-correlated GBM; a multivariate GBM model; a univariate K-fold cross-correlated GLM model; and a univariate non-K-fold cross-correlated GLM model. In some embodiments, the plurality of statistical models comprises one or more of: a multivariate, bivariate, or univariate K-fold cross-correlated XGBoost model; a multivariate, bivariate, or univariate K-fold cross-correlated Random Forest model; a multivariate, bivariate, or univariate K-fold cross-correlated GBM model; a multivariate, bivariate, or univariate K-fold cross-correlated GLM model; and a univariate non-K-fold cross-correlated GLM model. In some embodiments, the plurality of statistical models comprises at least: a univariate K-fold cross-correlated XGBoost model; a multivariate XGBoost model; a univariate K-fold cross-correlated Random Forest model; a multivariate Random Forest model; a univariate K-fold cross-correlated GBM model; a multivariate GBM model; a univariate K-fold cross-correlated GLM model; and a univariate non-K-fold cross-correlated GLM model.

Optionally, the initial model is an eXtreme Gradient Boosting (XGBoost) model.

In some embodiments, tuning parameters of the initial model comprises evaluating a F measure according to Equation (1):

$$\frac{1}{F_\beta} = \frac{1}{1+\beta^2}\left(\frac{1}{P} + \frac{\beta^2}{R}\right); \quad (1)$$

wherein Fβ stands for a harmonic mean of precision and recall, P stands for precision, R stands for recall, β stands for a parameter that controls a balance between P and R. Optionally, β is in a range of 0.80 to 0.90, e.g., 0.85, to achieve a higher precision.

In some embodiments, a grid search method is used for tuning hyperparameters of the model (e.g., the XGBoost model). Table 13 shows an example of tuning results.

Table 13 shows an example of tuning results using a grid search method.

| Hyperparameter | Value |
|---|---|
| reg_alpha | 0.145 |
| subsample | 0.835 |
| max_depth | 5 |
| Learning_rate | 0.458 |
| n_estimators | 75 |

In another aspect, the present disclosure further provides a predictive model trained by the computer-implemented method as described herein. The predictive model may be used to predict the defect occurrence of a present glass, once parameters in one or more steps of fabricating the present glass is obtained. The predictive model may be utilized in deciding whether the present glass is defective and should be discarded.

In another aspect, the present disclosure further provides an intelligent detect analysis system. In some embodiments, the intelligent defect analysis system includes a distributed computing system including one or more networked computers configured to execute in parallel to perform at least one common task; one or more computer readable storage mediums storing instructions that, when executed by the distributed computing system, cause the distributed computing system to execute software modules. In some embodiments, the software modules include a data manager configured to store data, and intelligently extract, transform, or load the data; a query engine connected to the data manager and configured to query the data directly from the data manager; an analyzer connected to the query engine and configured to perform defect analysis upon received a task request, the analyzer including a plurality of business servers and a plurality of algorithm servers, the plurality of algorithm servers configured to query the data directly from the data manager; and a data visualization and interaction interface configured to generate the task requests. Optionally, the intelligent defect analysis system is used for defect analysis in fabrication of display panels. As used herein, the term "distributed computing system" generally refers to an interconnected computer network having a plurality of network nodes that connect a plurality of servers or hosts to one another or to external networks (e.g., the Internet). The term "network node" generally refers to a physical network device. Example network nodes include routers, switches, hubs, bridges, load balancers, security gateways, or firewalls, A "host" generally refers to a physical computing device configured to implement, for instance, one or more virtual machines or other suitable virtualized components. For example, a host can include a server having a hypervisor configured to support one or more virtual machines or other suitable types of virtual components.

In some embodiments, one or more of the plurality of algorithm servers is configured to perform the computer-implemented method for defect analysis described herein.

In some embodiments, one or more of the plurality of algorithm servers is configured to perform the computer-implemented method of evaluating likelihood of defect occurrence described herein.

Various defects may occur in manufacturing of semiconductor electronics. Examples of defects include particle, remain, line defect, hole, splash, wrinkle, discoloration, and bubble. Defects occurring in the manufacturing of semiconductor electronics are difficult to trace. For example, engineers may have to rely on manual data sorting to analyze the root cause of defects based on experience.

In manufacturing a liquid crystal display panel, the fabrication of a display panel include at least an array stage, a color filter (CF) stage, a cell stage, and a module stage. In the array stage, a thin film transistor array substrate is fabricated. In one example, in the array stage, a material layer is deposited, the material layer is subject to lithography for example a photoresist is deposited on the material layer, the photoresist is subject to exposure and subsequently developed. Subsequently, the material layer is etched and the remaining photoresist is removed ("strip"). In the CF stage, a color filter substrate is fabricated, involving several steps including coating, exposure, and development. In the cell stage, the array substrate and the color filter substrate are assembled to form a cell. The cell stage includes several steps including coating and rubbing an alignment layer, injection of liquid crystal materials, cell sealant coating, cell assembly under vacuum, cutting, grinding, and cell inspection. In the module stage, peripheral components and circuits are assembled onto the panel, in one example, the module stage includes several steps including assembling of a back light, and assembling of a primed circuit board, polarizer attachment, assembling of chip-on-film, assembling of integrated circuits, aging, and final inspection.

In manufacturing an organic light emitting diode (OLED) display panel, the fabrication of a display panel include at least four device processes, include an array stage, an OLED stage, an EAC2 stage, and a Module stage. In the array stage, a back panel of the display panel is fabricated, e.g., including fabrication of a plurality of thin film transistors. In the OLED stage, a plurality of light emitting elements (e.g., organic light emitting diodes) are fabricated, an encapsulating layer is formed to encapsulate the plurality of light emitting elements, and optionally a protective film is formed on the encapsulating layer. In the EAC2 stage, large glasses are first cut into half glasses, and then further cut into panels. Moreover, in the EAC2 stage, inspection equipment is used to inspect the panels to detect defects therein, for example, dark spots and bright lines. In the Module stage, flexible printed circuits are bonded to the panels, e.g., using chip-on-film technology. Cover glass are formed on the surface of the panels. Optionally, further inspections are performed to detect defects in the panels. The data from the fabrication of display panels include biographical information, parameter information, and defect information, which are stored in a plurality of data sources. The biographical information is the record information uploaded to the database by each processing equipment from the array stage to the Module stage, including glass ID, equipment model, site information and so on. The parameter information includes data generated by the equipment when processing the glass. Defects may occur in each of the stages. The inspection information may be generated in each of the stages discussed above. Only after the inspection is completed, the inspection information can be uploaded to the database in real time. The inspection information may include detect type and defect position.

In summary, biographical information, parameter information, and defect information are obtained using various sensors and inspection equipment. The biographical information, parameter information, and defect information are analyzed using the intelligent defect analysis method or system, which can quickly determine device, site, and/or stage that generates a defect, providing critical information for subsequent process improvement and equipment repair or maintenance, greatly improving yield.

Accordingly, the present disclosure provides, inter alia, a data management platform, an intelligent defect analysis system, an intelligent defect analysis method, a computer-program product, and a method for defect analysis thereof that substantially obviate one or more of the problems due to limitations and disadvantages of the related art. The present disclosure provides an improved data management platform having superior functionality. Based on the present data management platform (or other suitable database or data management platform), the inventors of the present disclosure further develop a novel and unique intelligent defect analysis system, an intelligent defect analysis method, a computer-program product, and a method for defect analysis.

In one aspect, the present disclosure provides an intelligent defect analysis system. In some embodiments, the intelligent defect analysis system includes a distributed computing system including one or more networked computers configured to execute in parallel to perform at least one common task; one or more computer readable storage mediums storing instructions that, when executed by the distributed computing system, cause the distributed computing system to execute software modules. In some embodiments, the software modules include a data management platform configured to store data, and intelligently extract, transform, or load the data, wherein the data comprises at least one of biographical data information, parameter information, or defect information; an analyzer configured to perform defect analysis upon receiving a task request, the analyzer including a plurality of business servers and a plurality of algorithm servers, the plurality of algorithm servers configured to obtain the data directly from the data management platform and perform algorithm analysis on the data to derive a result data on underlying reasons for defects; and a data visualization and interaction interface configured to generate the task requests. Optionally, the intelligent defect analysis system is used for defect analysis in fabrication of display panels. As used herein, the term "distributed computing system" generally refers to an interconnected computer network having a plurality of network nodes that connect a plurality of servers or hosts to one another or to external networks (e.g., the Internet). The term "network node" generally refers to a physical network device. Example network nodes include routers, switches, hubs, bridges, load balancers, security gateways, or firewalls. A "host" generally refers to a physical computing device configured to implement, for instance, one or more virtual machines or other suitable virtualized components. For example, a host can include a server having a hypervisor configured to support one or more virtual machines or other suitable types of virtual components.

Figure 9:
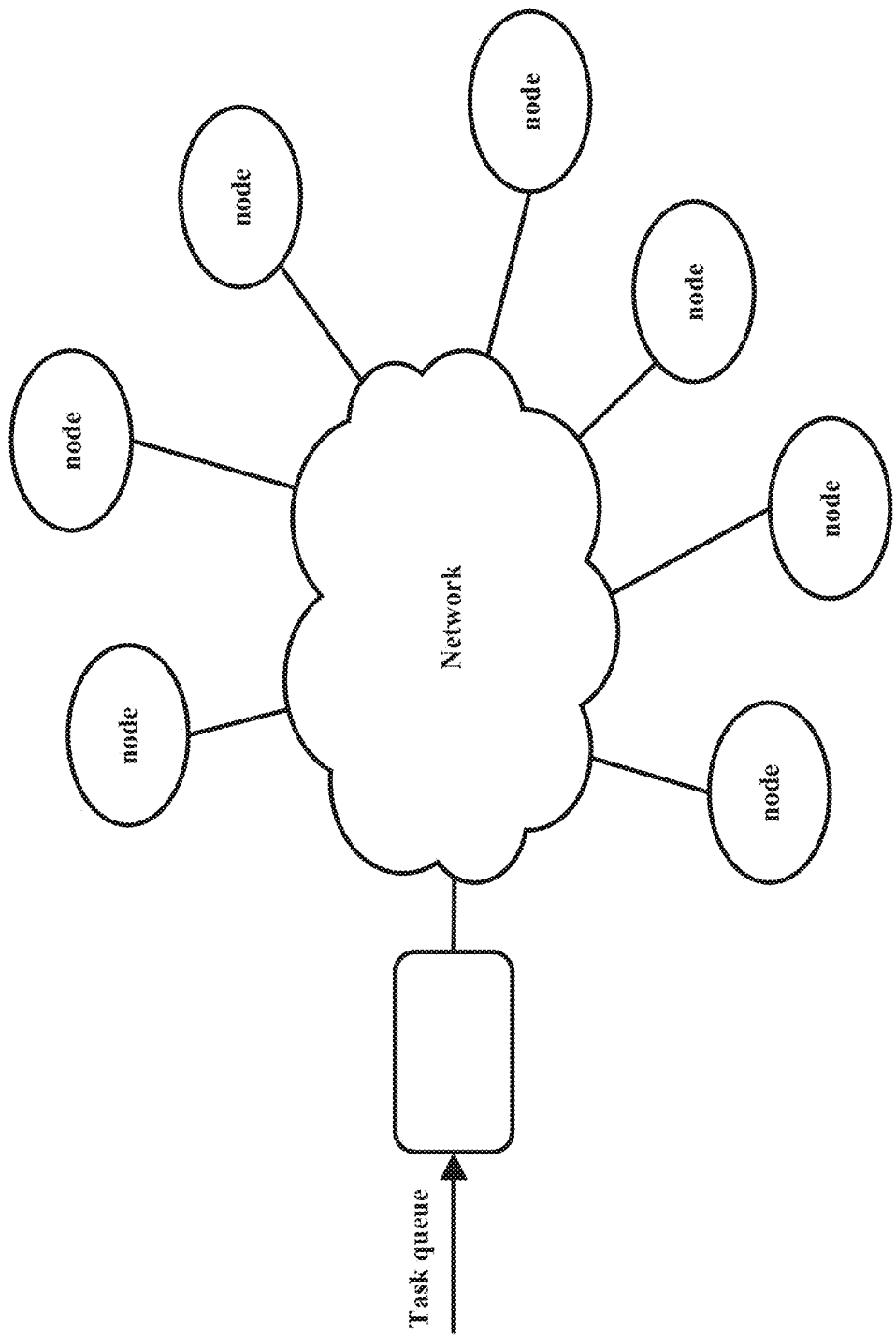
FIG. 9 illustrates a distributed computing environment in some embodiments according to the present disclosure.

FIG. 9 illustrates a distributed computing environment in some embodiments according to the present disclosure. Referring to FIG. 9, in a distributed computing environment, a number of autonomous computers/workstations, called nodes, are in communication with one another in a network, for example, a LAN (Local Area Network), to solve a task, such as execute an application. Each of the computer nodes typically includes its own processor(s), memory and a communication link to other nodes. The computers can be located within a particular location (e.g. cluster network) or can be connected over a large area network (LAN) such as the Internet. In such a distributed computing environment, different applications may share information and resources.

The network in the distributed computing environment may include local area networks (LAN) and wide area networks (WAN). The network may include wired technologies (e.g., Ethernet®) and wireless technologies (e.g., WiFi®, code division multiple access (CDMA), global system for mobile (GSM), universal mobile telephone service (UMTS), Bluetooth®, ZigBee®, etc.).

Multiple computing nodes are configured to join a resource group in order to provide distributed services. A computing node in the distributed network may include any computing device such as computing device or a user device. A computing node may also include data centers. As used herein, a computing node may refer to any computing device or multiple computing device (i.e., a data center). Software modules may be executed on a single computing node (e.g., a server) or distributed across multiple nodes in any suitable manner.

The distributed computing environment may also include one or more storage nodes for storing information related to execution of software modules, and/or output generated by execution of software modules, and/or other functions. The one or more storage nodes are in communication with one another in a network, and are in communication with one or more of the computing nodes in the network.

Figure 10:
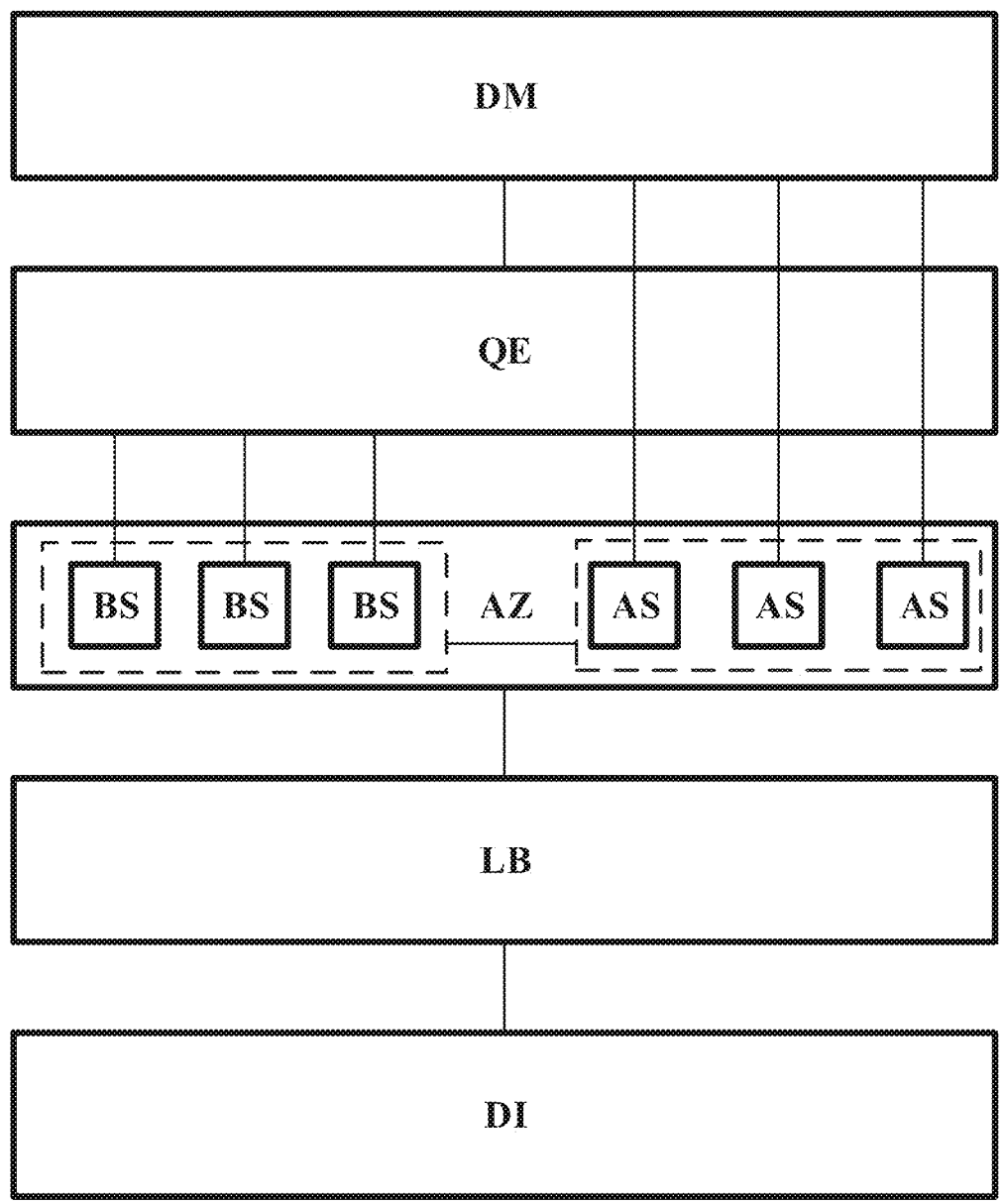
FIG. 10 illustrates software modules in an intelligent defect analysis system in some embodiments according to the present disclosure.

FIG. 10 illustrates software modules in an intelligent defect analysis system in some embodiments according to the present disclosure. Referring to FIG. 10, the intelligent defect analysis system includes a distributed computing system including one or more networked computers configured to execute in parallel to perform at least one common task; one or more computer readable storage mediums storing instructions that, when executed by the distributed computing system, cause the distributed computing system to execute software modules. The software modules in some embodiments includes a data management platform DM configured to store data, and intelligently extract, transform, or load the data; a query engine QE connected to the data management platform DM and configured to obtain the data directly from the data management platform DM; an analyzer AZ connected to the query engine QE and configured to perform defect analysis upon receiving a task request, the analyzer AZ including a plurality of business servers BS (similar to backend servers) and a plurality of algorithm servers AS, the plurality of algorithm servers AS configured to obtain the data directly from the data management platform DM; and a data visualization and interaction interface DI configured to generate the task requests. Optionally, the query engine QE is a query engine based on Impala™ technology. As used herein, the term "connected to" in the context of the present disclosure refers to a relationship of having direct information or data flow from a first component of the system to a second component, and/or from the second component of the system to the first component.

Figure 11:
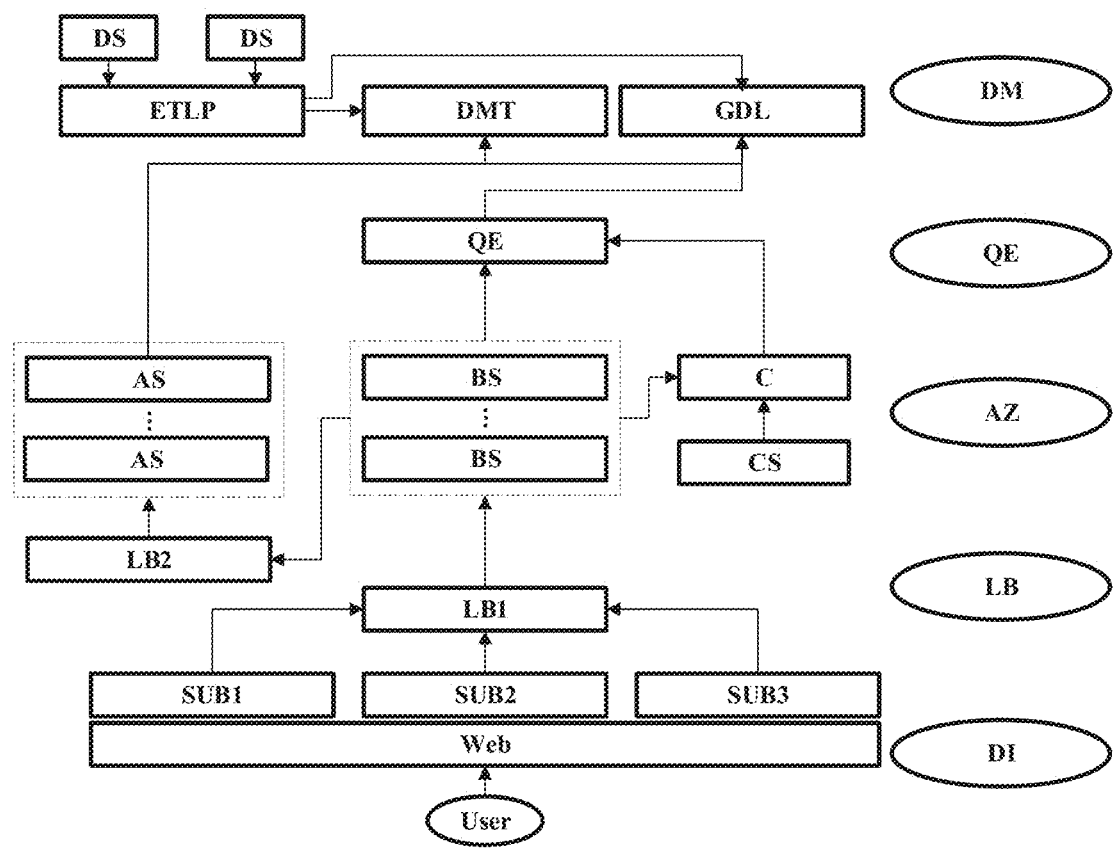
FIG. 11 illustrates software modules in an intelligent defect analysis system in some embodiments according to the present disclosure.

FIG. 11 illustrates software modules in an intelligent detect analysis system in some embodiments according to the present disclosure. Referring to FIG. 11, the data management platform DM in some embodiments includes an ETL module ETLP configured to extract, transform, or load data from a plurality of data sources DS onto a data mart DMT and a general data layer GDL. Upon receiving an assigned task, a respective one of the plurality of algorithm servers AS is configured to obtain a first data directly from the data mart DMT. Upon performing detect analysis, the respective one of the plurality of algorithm servers AS is configured to transmit a second data directly to the general data layer GDL. The plurality of algorithm servers AS deploy various common algorithms for defect analysis, e.g., algorithms based on big data analysis. The plurality of algorithm servers AS are configured to analyze the data to identify the causes of the defects. As used herein, the term "ETL module" refers to a computer program logic configured to provide functionality such as extracting, transforming, or loading data. In some embodiments, the ETL module is stored on a storage node, loaded into a memory, and executed by a processor. In some embodiments, the ETL module is stored on one or more storage nodes in a distributed network, loaded into one or more memory in the distributed network, and executed by one or more processors in the distributed network.

The data management platform DM stores data for the intelligent defect analysis system. For example, the data management platform DM stores data needed for algorithm analysis by the plurality of algorithm servers AS. In another example, the data management platform DM stores results of algorithm analysis. The data management platform DM in some embodiments includes the plurality of data sources DS (e.g., data stored in oracle databases), the ETL module ETLP, a data mart DMT (e.g., a data mart based on Apache Hbase™ technology), and the general data layer GDL (e.g., a data storage based on Apache Hive™ technology). For algorithm analysis and interactive display to a user, the data from the plurality of data sources DS are cleansed and consolidated into validated data by the ETL module ETLP. Examples of useful data for defect analysis include tracking history data, dv parameter data, map detect position data, and so on. The amount of data in a typical manufacturing process (e.g., of display panels) is huge, for example, there might be over 30 million items of dv parameter data each day in a typical manufacturing site. To meet the user's demand for defect analysis, it is necessary to increase the speed of reading production data by the algorithm server. In one example, the data required for algorithm analysis is stored in a data mart based on Apache Hbase™ technology to improve efficiency and save storage space. In another example, results of algorithm analysis and other auxiliary data are stored in a general data layer based on Apache Hive™ technology.

Apache Hive™ is an open source data warehouse system built on top of Hadoop used for querying and analyzing large data in form of structured and semi-structured stored in Hadoop files. Apache Hive™ is mainly used for hatch processing and thus is known as OLAP. Also Real time processing is not possible in case of Hive. Apache Hive™ is not a database and has schema model.

Apache Hbase™ is a non-relational column-oriented distributed database which runs on the top of Hadoop distributed file system (HDFS). Moreover it is a NoSQL open source database that stores data in columns. Apache Hbase™ is mainly used for transactional processing and known as OLTP. However Real time processing is possible in case of Apache Hbase™. Apache Hbase™ is a type of NoSQL database and is free from schema model.

In one example, various components of the data management platform (e.g., the general data layer, the data warehouse, the data source) may be in form of a distributed data storage cluster, e.g., based on Apache Hadoop™ and/or Apache Hive™.

Figure 16:
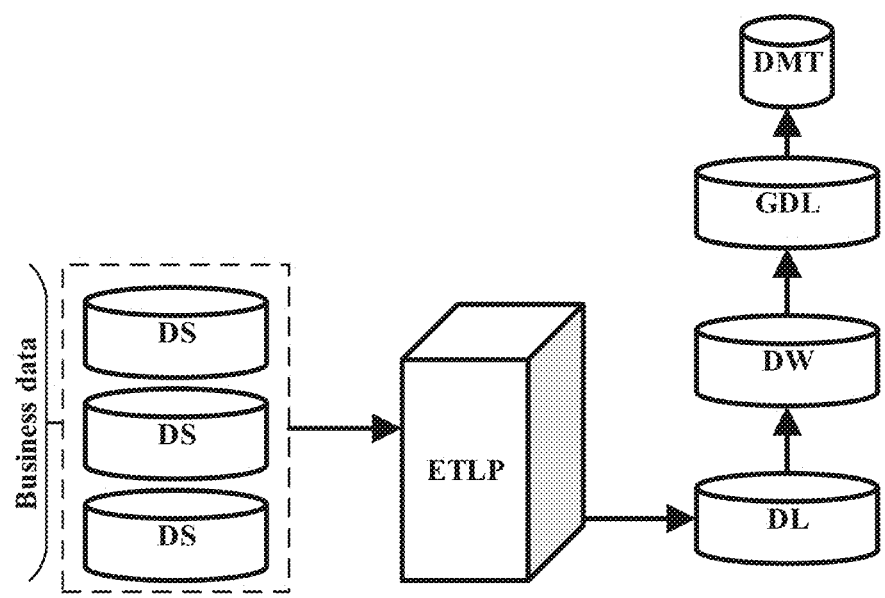
FIG. 16 illustrates a data management platform in some embodiments according to the present disclosure.

FIG. 16 illustrates a data management platform in some embodiments according to the present disclosure. Referring to FIG. 16, in some embodiments, the data management platform includes a distributed storage system (DFS), such as Hadoop Distributed File System (HDFS). The data management platform is configured to collect data generated in a factory production process from a plurality of data sources DS. The data generated in the factory production process is stored in a relational database (e.g., oracle), e.g., using a RDBMS (Relational Database Management System) grid computing technique. In the RDBMS grid computing, a problem that requires very large amounts of computer power is divided into many small parts, which are distributed to many computers for processing. The results of distributed computing are combined to obtain the final result. For example, in an Oracle RAC (Real Application Cluster), all servers have direct access to all the data in the database. RDBMS grid computing based applications, however, have limited hardware scalability. When the amount of data reaches a certain order of magnitude, the input/output bottleneck of the hard disk makes it very inefficient to process large amounts of data. The parallel processing of the distributed file system can meet the challenge presented by the demand of increasing data storage and computing. In the process of intelligent detect analysis, first extracting the data from the plurality of data sources DS into the data management platform greatly expedite the process.

In some embodiments, the data management platform includes a plurality of groups of data having different contents and/or storage structure. In some embodiments, the ETL module ETLP is configured to extract raw data from a plurality of data sources DS into the data management platform, forming a first data layer (e.g., a data lake DL). The data lake DL is a centralized HDFS or kudu database that is configured to store any structure or unstructured data. Optionally, the data lake DL is configured to store a first group of data extracted by the ETL module ETLP from a plurality of data sources DS. Optionally, the first group of data and the raw data have a same content. The dimension and attributes of the raw data are preserved in the first group of data. In some embodiments, the first group of data stored in the data lake is dynamically updated. Optionally, the first group of data includes a real-time updated data stored in a Kudu™-based database, or a periodically updated data stored in a Hadoop distributed file system. In one example, the periodically updated data stored in the Hadoop distributed file system is a periodically updated data stored in a storage based on Apache Hive™.

In some embodiments, the data management platform includes a second data layer, e.g., the data warehouse DW. The data warehouse DW includes an internal storage system configured to provide data in abstracted manner such as in a table format or a View format, without exposing the file system. The data warehouse DW may be based on Apache Hive™. The ETL module ETLP is configured to extract, cleanse, transform, or load the first group of data to form a second group of data. Optionally, the second group of data is formed by subjecting the first group of data to cleansing and standardization.

In some embodiments, the data management platform includes a third data layer (e.g., a general data layer GDL). The general data layer GDL may be based on Apache Hive™. The ETL module ETLP is configured to perform data fusion on the second group of data, thereby forming a third group of data. In one example, the third group of data is a data resulting from subjecting the second group of data to data fusion. Examples of data fusion include concatenation based on a same field in multiple tables. Examples of data fusion further include generation of statistics of a same field or record (e.g., summation and percentage calculation). In one example, generation of statistics includes counting a number of defective panels in a glass, and a percentage of defective panels among a plurality of panels in a same glass. Optionally, the general data layer GDL is based on Apache Hive™. Optionally, the general data layer GDL is used for data query.

In some embodiments, the data management platform includes a fourth data layer (e.g., at least one data mart). In some embodiments, the at least one data mart include a data mart DMT. Optionally, the data mart DMT is a database of NoSQL type storing information available for computational processing. Optionally, the data mart DMT is based on Apache Hbase™. Optionally, the data mart DMT is used for computation. The ETL module ETLP is configured to layerize the third data layer to form a fourth group of data having a multi-layer index structure. The fourth group of data categorizes data based on different types and/or rules, thereby forming the multi-layer index structure. The first index in the multi-layer index structure corresponds to filtering criteria of a front-end interface, e.g., corresponds to user-defined analysis criteria in an interactive task sub-interface in communication with the data management platform, facilitating a more expedited data query and computation process.

In some embodiments, the data in the general data layer GDL can be imported into the data mart DMT. In one example, a first table is generated in the data mart DMT, and a second table (e.g., an external table) is generated in the general data layer GDL. The first table and the second table are configured to be synchronized so that when data is written into the second table, the first table will be simultaneously updated to include corresponding data.

In another example, a distributed computing processing module may be used for reading data written onto the general data layer GDL. Hadoop MapReduce module may be used as the distributed computing processing module for reading data written onto the general data layer GDL. The data written onto the general data layer GDL may then be written onto the data mart DMT. In one example, the data may be written into the data mart DMT using a HBase Api.

In another example, the Hadoop MapReduce module, once read the data written onto the data mart DMT, can generate HFile, which is Bulkloaded onto the data mart DMT.

In some embodiments, data flow, data transformation, and data structure among various components of the data management platform are described herein. In some embodiments, raw data collected by the plurality of data sources DS includes at least one of biographical data information, parameter information, or defect information. The raw data optionally may contain dimension information (time, plant, equipment, operator, Map, chamber, Slot, etc.) and attribute information (plant location, equipment age, number of bad points, exception parameters, energy consumption parameters, process duration, etc.).

Biographical data information contains information of specific processes a product (such as a panel or a glass) is subject to during the manufacturing. Examples of specific processes a product is subject to during the manufacturing include factory, process, site, device, chamber, card slot, and operator.

Parameter information contains information of information of specific environmental parameters and changes thereof a product (such as a panel or a glass) is subject to during the manufacturing. Examples of specific environmental parameters and changes thereof a product is subject to during the manufacturing include environmental particle condition, device temperature, and device pressure.

Defect information contains information of product quality based upon inspection. Examples product quality information include defect type, defect position, and defect dimension.

In some embodiments, parameter information includes device parameter information. Optionally, device parameter information includes at least three types of data, which may be exported from a General Model for Communications and Control of Manufacturing Equipment (GEM) interface. A first type of data that can be exported from a GEM interface is data variable (DV), which can be collected as the event occurs. Thus, the data variable is only valid in the context of the event. In one example, the GEM interface can provide an event called PPChanged, which is triggered when a recipe is changed; and a data variable named "changed recipe", which is only valid in the context of the PPChanged event. Polling this value at other times may have invalid or unexpected data. A second type of data that can be exported from a GEM interface is status variable (SV), which contains device specific information that is valid at any time. In one example, the device may be a temperature sensor, and the GEM interface provides temperature status variable of one or more modules. The host can request a value of this status variable at any time, and can expect that the value to be true. A third type of data that can be exported from a GEM interface is device constant (EC), which contains data items set by the device. The device constant determines the behavior of the device. In one example, the GEM interface provides a device constant name "MaxSimultaneousTraces" that specifies the maximum number of traces that can be requested from the host at the same time. The value of the device constant is always guaranteed to be valid and up-to-date.

In some embodiments, the data lake DL is configured to store a first group of data formed by extracting raw data from a plurality of data sources by the ETL module ETLP, the first group of data having same contents as the raw data. The ETL module ETLP is configured to extract the raw data from the plurality of data sources DS while maintaining the dimension information (e.g., dimension columns) and the attribute information (e.g., attribute columns). The data lake DL is configured to store the extracted data arranged according to time of extraction. The data may be stored in the data lake DL with a new name indicating "data lake" and/or attribute(s) of respective data sources, while maintaining the dimension and attributes of the raw data. The first group of data and the raw data are stored in different forms. The first group of data is stored in a distributed file system, while the raw data is stored in a relational database such as an Oracle database. In one example, the business data collected by the plurality of data sources DS includes data from various business systems, including, for example, yield management system (YMS), fault detection and classification (FDC) system, and manufacturing execution system (MES). The data in these business systems have their respective signatures, such as product model, production parameters and equipment model data. The ETL module ETLP, using tools such as sqoop command, number stack tool, pentaho tool, extracts raw production data from each of the business systems into hadoop in the original data format, thereby achieving convergence of data from multiple business systems. The extracted data are stored in the data lake DL. In another example, the data lake DL is based on technologies such as Hive™ and Kudu™. The data lake DL contains dimension columns (time, plant, equipment, operator, Map, chamber, Slot, etc.) and attribute columns (plant location, equipment age, number of bad points, exception parameters, energy consumption parameters, process duration, etc.) involved in the factory automation process.

In one example, the present data management platform integrates various business data (e.g., data associated with semiconductor electronics manufacturing) into the plurality of data sources DS (e.g., Oracle databases). The ETL module ETLP extracts the data from the plurality of data sources DS into the data lake DL, for example, using a number stack tool, a SQOOP tool, a kettle tool, a Pentaho tool, or a DataX tool. The data is then cleansed, transformed and loaded into the data warehouse DW and the general data layer GDL. The data warehouse DW, the general data layer GDL, and the data mart DMT store huge amount of data and analytical results, utilizing tools such as Kudi™, Hive™, and Hbase™.

Information generated in various stages of the fabrication process is obtained by various sensors and inspection equipment, and subsequently saved in the plurality of data sources DS. Computation and analysis results generated by the present intelligent defect analysis system are also saved in the plurality of data sources DS. Data synchronization (flow of data) among the various components of the data management platform is realized through the ETL module ETLP. For example, the ETL module ETLP is configured to obtain parameter configuration templates of synchronized processes, including network permissions and database port configuration, in-flow data library name and table names, out-flow data library name and table names, field correspondence, task type, scheduling cycle, and so on. The ETL module ETLP configures parameters to the synchronized processes based on the parameter configuration templates. The ETL module ETLP synchronizes data and cleanses synchronized data based on process configuration templates. The ETL module ETLP cleanses the data through SQL statements to remove null, remove outliers, and establish correlation between related tables. Data synchronization tasks include data synchronization between the plurality of data sources DS and the data management platform, and data synchronization among various layers (e.g., the data lake DL, the data warehouse DW, the general data layer GDL, or the data mart DMT) of the data management platform.

In another example, data extraction to the data lake DL may be done in real time or offline. In the offline mode, the data extraction tasks are scheduled periodically. Optionally, in the offline mode, the extracted data may be stored in a storage based on Hadoop distributed file system (e.g., a Hive™-based database). In the real-time mode, the data extraction tasks may be performed by OGG (Oracle GoldenGate) in combination with Apache Kafka. Optionally, in the real time mode, the extracted data may be stored in Kudu™-based database. OGG reads the log files in the plurality of data sources (e.g., oracle database) to get the add/delete data. In another example, the topic information is read by flink, json is selected as the synchronized field type. The data is parsed using jar package, and the parsed information is transmitted to kudu api to realize the add/delete of kudu table data. In one example, a front-end interface may perform displaying, querying, and/or analysis based on data stored in the Kudu™-based database. In another example, the front-end interface may perform displaying, querying, and/or analysis based on data stored in any one or any combination of the Kudu™-based database, a Hadoop distributed file system (e.g., an Apache Hive™-based database), and/or an Apache Hbase™-based database. In another example, short term data (e.g., generated within several months) is stored in the Kudu™-based database, and long term data (e.g., an entirety of data generated in all periods) is stored in a Hadoop distributed file system (e.g., the Apache Hive™-based database). In another example, the ETL module ETLP is configured to extract data stored in the Kudu™-based database into the a Hadoop distributed file system (e.g., the Apache Hive™-based database).

The data warehouse DW is built based on the data lake DL, by combing the data from various business systems (MDW, YMS, MES, FDC, etc.). The data extracted from the data lake DL is partitioned according to task execution time, which does not fully match the time stamp in the raw data. In addition, there is a possibility of data duplication. Thus, it is necessary to build the data warehouse DW based on the data lake DL, by cleaning and standardizing the data in the data lake DL to meet the needs of upper layer applications for data accuracy and partitioning. The data tables stored in the data warehouse DW is obtained by subjecting the data in the data lake DL to cleaning and standardization. Based on user requirements, the field format is standardized to ensure that the data tables in the data warehouse DW are completely consistent with that in the plurality of data sources DS. At the same time, the data is partitioned by day or month according to time and other fields, greatly improving query efficiency and reducing running memory requirement. The data warehouse DW may be one or any combination of the Kudu™-based database and an Apache Hive™-based database.

In some embodiments, the ETL module ETLP is configured to cleanse the extracted data stored in the data lake into the cleansed data, and the data warehouse is configured to store the cleansed data. Examples of cleansing performed by the ETL module ETLP include removal of redundant data, removal of null data, remove of dummy field, and so on.

In some embodiments, the ETL module ETLP is further configured to performed standardization (e.g., field standardization and format standardization) on the extracted data stored in the data lake, and the cleansed data are data subject to the field format standardization (e.g., format standardization of date and time information).

In some embodiments, at least a portion of the business data in the plurality of data sources DS is in a binary large object (blob) format. After the data extraction, at least a portion of the extracted data stored in the data lake DL is in a compressed hexadecimal format. Optionally, at least a portion of the cleansed data stored in the data warehouse DW is obtained by decompressing and processing the extracted data. In one example, the business systems (e.g., FDC system discussed above) are configured to store a huge amount of parameter data. Thus, the data has to be compressed into the blob format in the business systems. During data extraction (e.g., from the oracle database to the hive database), the blob field will be converted into a hexadecimal (HEX) string. To retrieve the parameter data stored in the file, the HEX file is decompressed and the contents of the file can be obtained directly thereafter. The required data is coded to form a long string, and the different contents are split by specific symbols, depending on output requirements. To obtain data in the required format, the long string is subject to operations such as cutting according to special characters and row-column conversion. The processed data is written into the target table (e.g., data in a table format stored in the data warehouse DW discussed above) along with the original data.

In one example, the cleansed data stored in the data warehouse DW maintains the dimension information (e.g., dimension columns) and the attribute information (e.g., attribute columns) of the raw data in the plurality of data sources DS. In another example, the cleansed data stored in the data warehouse DW maintains a same data table name as that in the plurality of data sources DS.

In some embodiments, the ETL module ETLP is further configured to generate a dynamically updated table that is automatically updated periodically. Optionally, a general data layer GDL is configured to store the dynamically updated table comprising information on defects of high occurrence, as discussed above. Optionally, the data mart DMT is configured to store the dynamically updated table comprising information on defects of high occurrence, as discussed above.

The general data layer GDL is built based on the data warehouse DW. In some embodiments, the GDL is configured to store a third group of data formed by subjecting the second group of data to data fusion by the ETL module ETLP. Optionally, the data fusion are performed based on different themes. The data in the general data layer GDL are highly themed and highly aggregated, greatly improving query speed. In one example, tables having correlation constructed according to different user needs or different themes may be built using the tables in the data warehouse DW, the tables being assigned names according to their respective utilities.

Various themes may correspond to different data analysis needs. For example, themes may correspond to different defect analysis needs. In one example, a theme may correspond to analysis of defects attributed to one or more fabrication node groups (e.g., one or more devices), and the data fusion based on said theme may include data fusion on biographical information of manufacturing process and defect information associated therewith. In another example, a theme may correspond to analysis of defects attributed to one or more parameter types, and the data fusion based on said theme may include data fusion on parameter feature information and defect information associated therewith. In another example, a theme may correspond to analysis of defects attributed to one or more device operations (e.g., device defined by a respective operation site at which the respective device perform a respective operation), and the data fusion based on said theme may include data fusion on parameter feature information, biographical information of manufacturing process, and defect information associated therewith. In another example, a theme may correspond to feature extraction on parameters of various types to generate parameter feature information, wherein one or more of a maximum value, a minimum value, an average value, and a median value are extracted for each type of parameters.

In some embodiments, defect analysis includes performing feature extraction on parameters of various types to generate parameter feature information; and performing data fusion on at least two of the parameter feature information, biographical information of a manufacturing process, and defect information associated therewith. Optionally, performing data fusion includes performing data fusion on parameter feature information and defect information associated therewith. Optionally, performing data fusion includes performing data fusion on parameter feature information, biographical information of the manufacturing process, and defect information associated therewith. In another example, performing data fusion includes performing data fusion on the parameter feature information and biographical information of the manufacturing process to obtain first fused data information; and performing data fusion on the first fused data information and defect information associated therewith to obtain second fused data information. In one example, the second fused data information includes glass serial nunber, manufacturing site information, device information, the parameter feature information, and the defect information. The data fusion is performed in the general data layer GDL, e.g., by building tables having correlation constructed according to user needs or themes. Optionally, the step of performing data fusion includes performing data fusion on the biographical information and the defect information. Optionally, the step of performing data fusion includes performing data fusion on all three of the parameter feature information, biographical information of a manufacturing process, and defect information associated therewith.

In one example, the CELL_PANEL_MAIN table in the data warehouse DW stores the basic biographical data of the panel in the cell factory, and the CELL_PANEL_CT table stores the details of the CT process in the factory. The general data layer GDL is configured to perform a correlation operation based on the CELL_PANEL_MAIN table and the CELL_PANEL_CT table, to create a wide table YMS_PANEL. The basic biographical data of the panel and the details of the CT process can be queried in the YMS_PANEL table. The YMS prefix in the table name "YMS_PANEL" stands for the themes for defect analysis, and the PANEL prefix stands for specific PANEL information stored in the table. By subjecting the tables in the data warehouse DW to the correlation operation by the general data layer GDL, data in different tables can be fused and correlated.

According to different business analysis requirements, and based on glass, hglass, and panel, the tables in the general data layer GDL can be classified into the following datatags: production biographic, defect rate, defect MAP, DV, SV, inspection data, and test data.

The data mart DMT is build based on the data warehouse DW and/or the general data layer GDL. The data mart DMT may be used for providing various reporting data and data needed for analysis, particularly highly customized data. In one example, customized data provided by the data mart DMT include consolidated data on defect rates, frequency of specific defects, and so on. In another example, data in the data lake DL and the general data layer GDL are stored in Hive-based databases, data in the data mart DMT are stored in Hbase-based databases. Optionally, table names in the data mart DMT can be kept consistent with those in the general data layer GDL. Optionally, the general data layer GDL is based on Apache Hive™ technology, and the data mart DMT is based on Apache Hbase™ technology. The general data layer GDL is used for data query through a user interface. Data in Hive can be quickly queried in Hive through Impala. The data mart DMT is used for computation. Based on the advantage of columnar data storage in Hbase, the plurality of algorithm servers AS can quickly access the data in the Hbase.

In some embodiments, the data mart DMT is configured to store a plurality of sub-tables split from a respective one of the data tables stored in the general data layer GDL. In some embodiments, the data stored in the data mart DMT and the data stored in the general data layer GDL have the same contents. The data stored in the data mart DMT and the data stored in the general data layer GDL differ from each other in that they are stored in different data models. Depending on different types of NoSQL databases used for the data mart DMT, the data in the data mart DMT may be stored in different data models. Examples of data models corresponding to different NoSQL databases include a key-value data model, a column family data model, a versioned document data model, and a graph structure data model. In some embodiments, a query to the data mart DMT may be performed based on specified keys, to quickly locate the data (e.g., values) to be queried. Accordingly, and as more specifically discussed below, the table stored in the general data layer GDL may be split into at least three sub-tables in the data mart DMT. The first sub-table corresponds to user-defined analysis criteria in an interactive task sub-interface. The second sub-table corresponds to specified keys (e.g., product serial numbers). The third sub-table corresponds to values (e.g., the values stored in the table in the general data layer GDL, comprising fused data). In one example, the data mart DMT utilizes a NoSQL database based on the Apache Hbase™ technology; the specified keys in the second sub-table may be row keys; and the fused data in the third sub-table may be stored in a column family data, model. Optionally, the fused data in the third sub-table may be fused data from at least two of the parameter feature information, biographical information of a manufacturing process, and defect information associated therewith. Moreover, the data mart DMT may include a fourth sub-table. Certain characters in the third sub-table may be stored in codes, for example, due to their lengths or other reasons. The fourth sub-table includes the characters (e.g., device names, fabrication sites) corresponding to these codes stored in the third sub-table. The indexes or queries among the first sub-table, the second sub-table, and the third sub-table may be based on the codes. The fourth sub-table may be utilized to replace the codes with the characters before the results are presented to the user interface.

In some embodiments, the plurality of sub-tables have index relationship between at least two sub-tables of the plurality of sub-tables. Optionally, data in the plurality of sub-tables are categorized based on types and/or rules. In some embodiments, the plurality of sub-tables includes a first sub-table (e.g., an attribute sub-table) comprising a plurality of environmental factors corresponding to user-defined analysis criteria in an interactive task sub-interface in communication with the data management platform; a second sub-table comprising product serial numbers (e.g., glass identification numbers or lot identification numbers); and a third sub-table (e.g., a main sub-table) comprising values in the third group of data that correspond to the product serial numbers. Optionally, based on different themes, the second sub-table may include different specified keys such as the glass identification numbers or the lot identification numbers (e.g., multiple second sub-tables). Optionally, values in the third group of data that correspond to the glass identification numbers through an index relationship between the third sub-table and the second sub-table. Optionally, the plurality of sub-tables further includes a fourth sub-table (e.g., a metadata sub-table) comprising values in the third group of data that correspond to the lot identification numbers. Optionally, the second sub-table further includes lot identification nwnbers; values in the third group of data that correspond to the lot identification numbers may be obtained through an index relationship between the second sub-table and the fourth sub-table. Optionally, the plurality of sub-tables further includes a fifth sub-table (e.g., a code generator sub-table) comprising manufacturing site information and device information. Optionally, the third sub-table includes codes or abbreviations for manufacturing site and device, through an index relationship between the third sub-table and the fifth sub-table, the manufacturing site information and device information may be obtained from the fifth sub-table.

Figure 17:
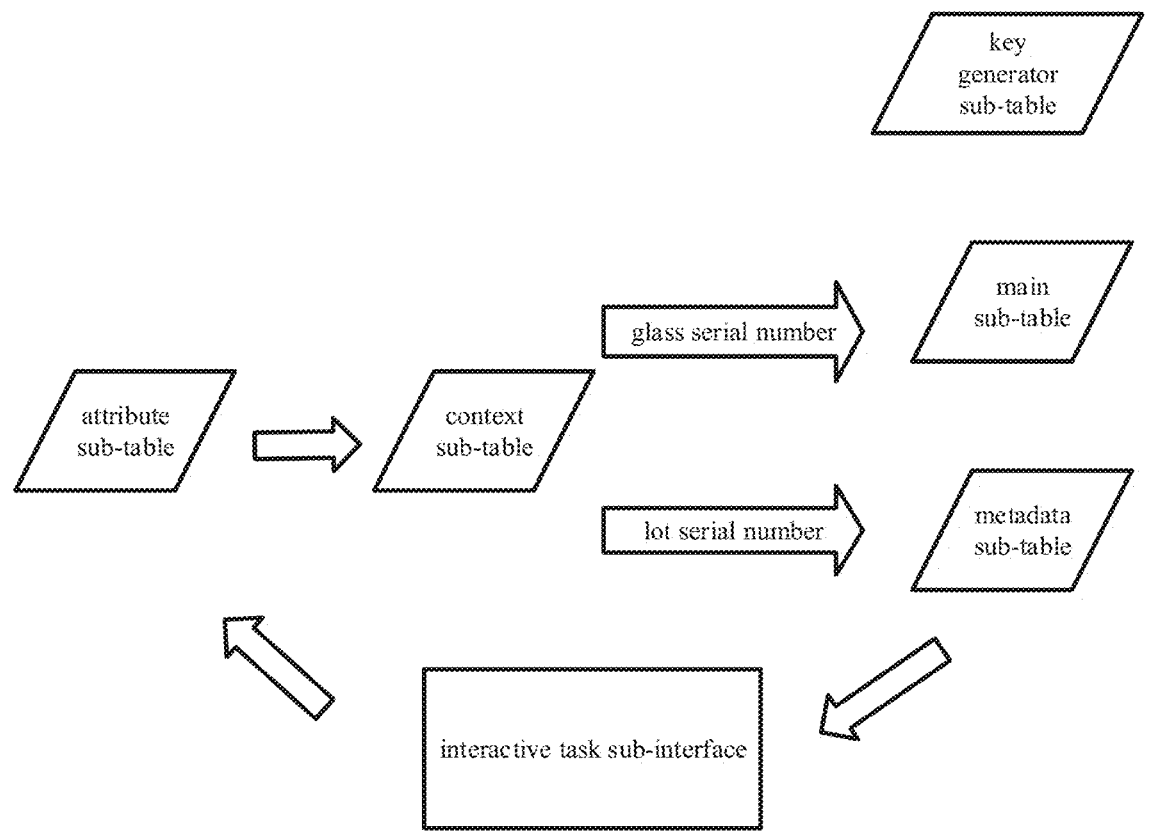
FIG. 17 depicts a plurality of sub-tables split from a data table stored in a general data layer in some embodiments according to the present disclosure.

FIG. 17 depicts a plurality of sub-tables split from a data table stored in a general data layer in some embodiments according to the present disclosure. Referring to FIG. 17, in some embodiments, the plurality of sub-tables include one or more of: an attribute sub-table comprising a plurality of environmental factors corresponding to user-defined analysis criteria in an interactive task sub-interface in communication with the data management platform; a context sub-table comprising at least first multiple environmental factors of the plurality of environmental factors and multiple manufacture stage factors, and multiple columns corresponding to second multiple environmental factors of the plurality of environmental factors; a metadata sub-table comprising at least a first manufacture stage factor of the multiple manufacture stage factors and a device factor associated with a first manufacture stage, and multiple columns corresponding to parameters generated in the first manufacture stage; a main sub-table comprising at least a second manufacture stage factor of the multiple manufacture stage factors, and multiple columns corresponding to parameters generated in a second manufacture stage; and a code generator sub-table comprising at least third multiple environmental factors of the plurality of environmental factors and the device factor.

In one example, the plurality of sub-tables include one or more of: an attribute sub-table including a key made up of datatag, factory information, manufacturing site information, product model information, product type information, and product serial number; a context sub-table including a key made up of first three numbers of MED5 encryption site, the factory information, the manufacturing site information, the datatag, manufacture end time, lot serial number, and glass serial number, a first column for the product model information, a second column for the product serial number, and a third column for the product type information; a metadata sub-table including a key made up of the first three numbers of MED5 encryption site, the lot serial number, the datatag, the manufacturing site information, and device information, a first column for manufacturing time, and a second column for manufacturing parameter; a main sub-table including a key made up of the first three numbers of MED5 encryption site, serial number, and the glass serial number, a first column for the manufacturing time, and a second column for manufacturing parameter; and a code generator sub-table including a key made up of the datatag, the manufacturing site information, and the device information. Optionally, the plurality of environmental factors in the attribute sub-table include datatag, factory information, manufacturing site information, product model information, product type information, and product serial number. Optionally, the multiple manufacture stage factors include the lot serial number and the glass serial number. Optionally, the device factor comprises the device information.

Referring to FIG. 10 and FIG. 11, the software modules in some embodiments further include a load balancer LB connected to the analyzer AZ. Optionally, the load balancer LB (e.g., a first load balancer LB1) is configured to receive task requests and configured to assign the task requests to one or more of the plurality of business servers BS to achieve load balance among the plurality of business servers BS. Optionally, the load balancer LB (e.g., a second load balancer LB2) is configured to assign tasks from the plurality of business servers BS to one or more of the plurality of algorithm servers AS to achieve load balance among the plurality of algorithm servers AS. Optionally, the load balancer LB is a load balancer based on Nginx™ technology.

In some embodiments, the intelligent defect analysis system is configured to meet demands of many users simultaneously. By having the load balancer LB (e.g., the first load balancer LB1), the system sends user requests to the plurality of business servers AS in a balanced manner, keeping the overall performance of the plurality of business servers AS optimal and preventing the slow response of services due to excessive pressure on a single server.

Similarly, by having the load balancer LB (e.g., the second load balancer LB2), the system sends tasks to the plurality of algorithm servers AS in a balanced manner, keeping the overall performance of the plurality of algorithm servers AS optimal. In some embodiments, when designing the load balancing strategy, not only the number of tasks sent to each of the plurality of algorithm servers AS should be considered, but also the amount of computational burden required by each task. In one example, three types of tasks are involved, including defect analysis of a type "glass", defect analysis of a type "hglass", and defect analysis of a type "panel". In another example, a number of defect data items associated with the type "glass" is 1 million per week on average, and a number of defect data items associated with the type "panel" is 30 million per week on average. Thus, the amount of computational burden required detect analysis of the type "panel" is far greater than the amount of computational burden required defect analysis of the type "glass". In another example, the load balancing is performed using a formula $f(x, y, z)=mx+ny+oz$, wherein x stands for the number of tasks for defect analysis of the type "glass"; y stands for the number of tasks for defect analysis of the type "hglass"; z stands for the number of tasks for defect analysis of the type "panel"; m stands for a weight assigned for defect analysis of the type "glass"; n stands for a weight assigned for defect analysis of the type "hglass"; and o stands for a weight assigned for defect analysis of the type "panel". The weights are assigned based on the amount of computational burden required defect analysis of each type. Optionally, $m+n+o=1$.

In some embodiments, the ETL module ETLP is configured to generate a dynamically updated table that is automatically updated periodically (e.g., every day, every hour, etc.). Optionally, the general data layer GDL is configured to store the dynamically updated table. In one example, the dynamically updated table is generated based on the logic of calculating the incidence of defects in a factory. In another example, data from multiple tables in the data management platform DM are consolidated and subject to various calculation to generate the dynamically updated table. In another example, the dynamically updated table includes information such as job name, defect code, occurrence frequency of defect code, the level of the defect code (glass/hglass/panel), factory, product model, date and other information. The dynamically updated table is updated regularly, when the production data in the data management platform DM changes, the information in the dynamically updated table will be updated accordingly, so as to ensure that the dynamically updated table can have all the factory's defect code information.

Figure 12:
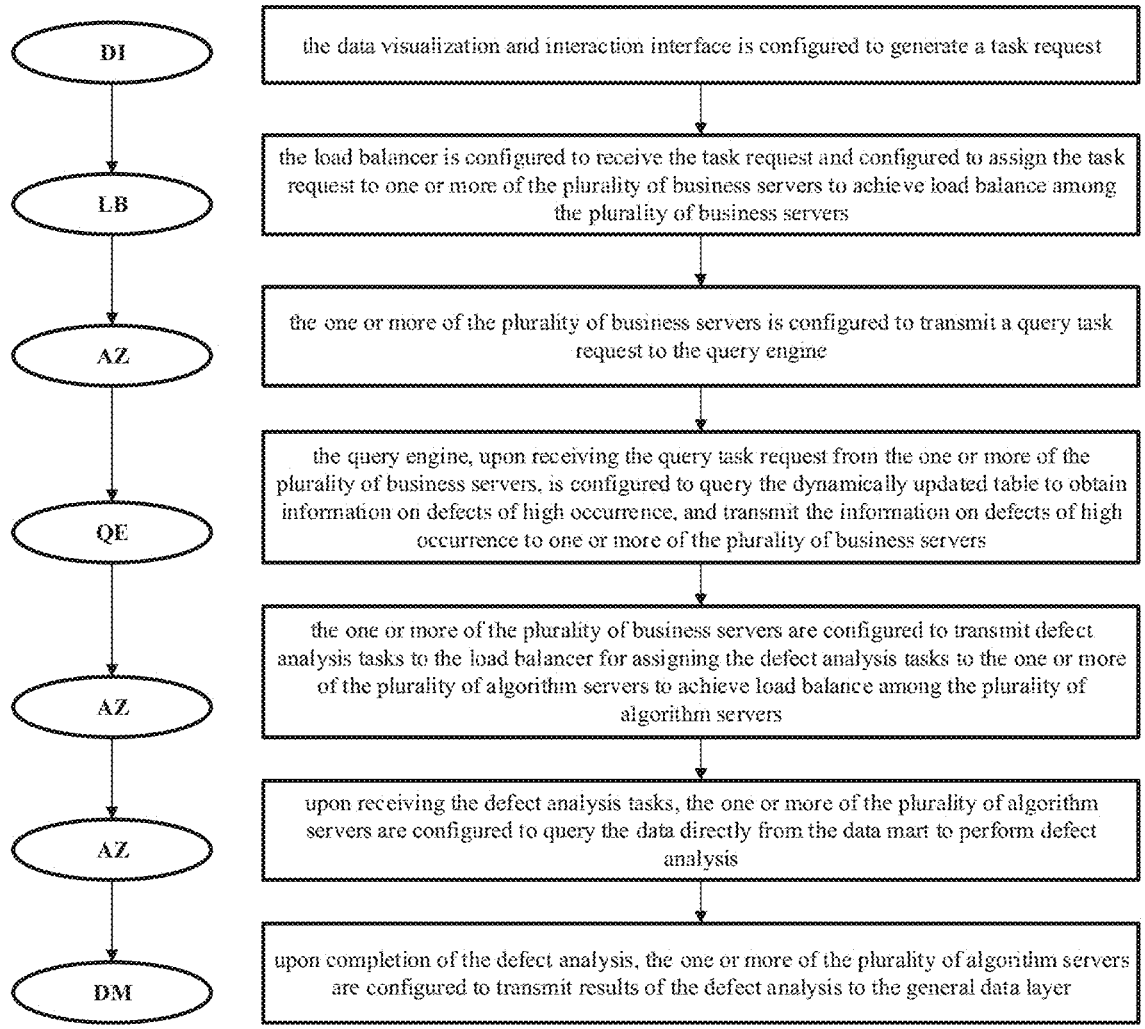
FIG. 12 illustrates an intelligent defect analysis method using an intelligent defect analysis system in some embodiments according to the present disclosure.

FIG. 12 illustrates an intelligent defect analysis method using an intelligent defect analysis system in some embodiments according to the present disclosure. Referring to FIG. 12, in some embodiments, the data visualization and interaction interface DI is configured to generate a task request; the load balancer LB is configured to receive the task request and configured to assign the task request to one or more of the plurality of business servers to achieve load balance among the plurality of business servers; the one or more of the plurality of business servers are configured to transmit a query task request to the query engine QE; the query engine QE, upon receiving the query task request from the one or more of the plurality of business servers, is configured to query the dynamically updated table to obtain information on defects of high occurrence, and transmit the information on defects of high occurrence to one or more of the plurality of business servers; the one or more of the plurality of business servers are configured to transmit defect analysis tasks to the load balancer LB for assigning the defect analysis tasks to the one or more of the plurality of algorithm servers to achieve load balance among the plurality of algorithm servers; upon receiving the defect analysis tasks, the one or more of the plurality of algorithm servers are configured to obtain the data directly from the data mart DMT to perform defect analysis; and upon completion of the defect analysis, the one or more of the plurality of algorithm servers are configured to transmit results of the defect analysis to the general data layer GDL.

The query engine QE enables fast access to the data management platform DM, e.g., reading and writing data quickly to or from the data management platform DM. As compared to direct query through a general data layer GDL, having the query engine QE is advantageous as it obviates the need of executing a map reduce (MR) program in order to query the general data layer GDL (e.g., Hive data storage). Optionally, the query engine QE may be a distributed query engine that can query the general data layer GDL (HDFS or Hive) in real time, greatly reducing latency and improving the responsiveness of the entire system. The query engine QE may be implemented using various appropriate technologies. Examples of technologies for implementing the query engine QE include Impala™ technology, Kylin™ technology, Presto™ technology, and Greenplum™ technology.

Figure 13:
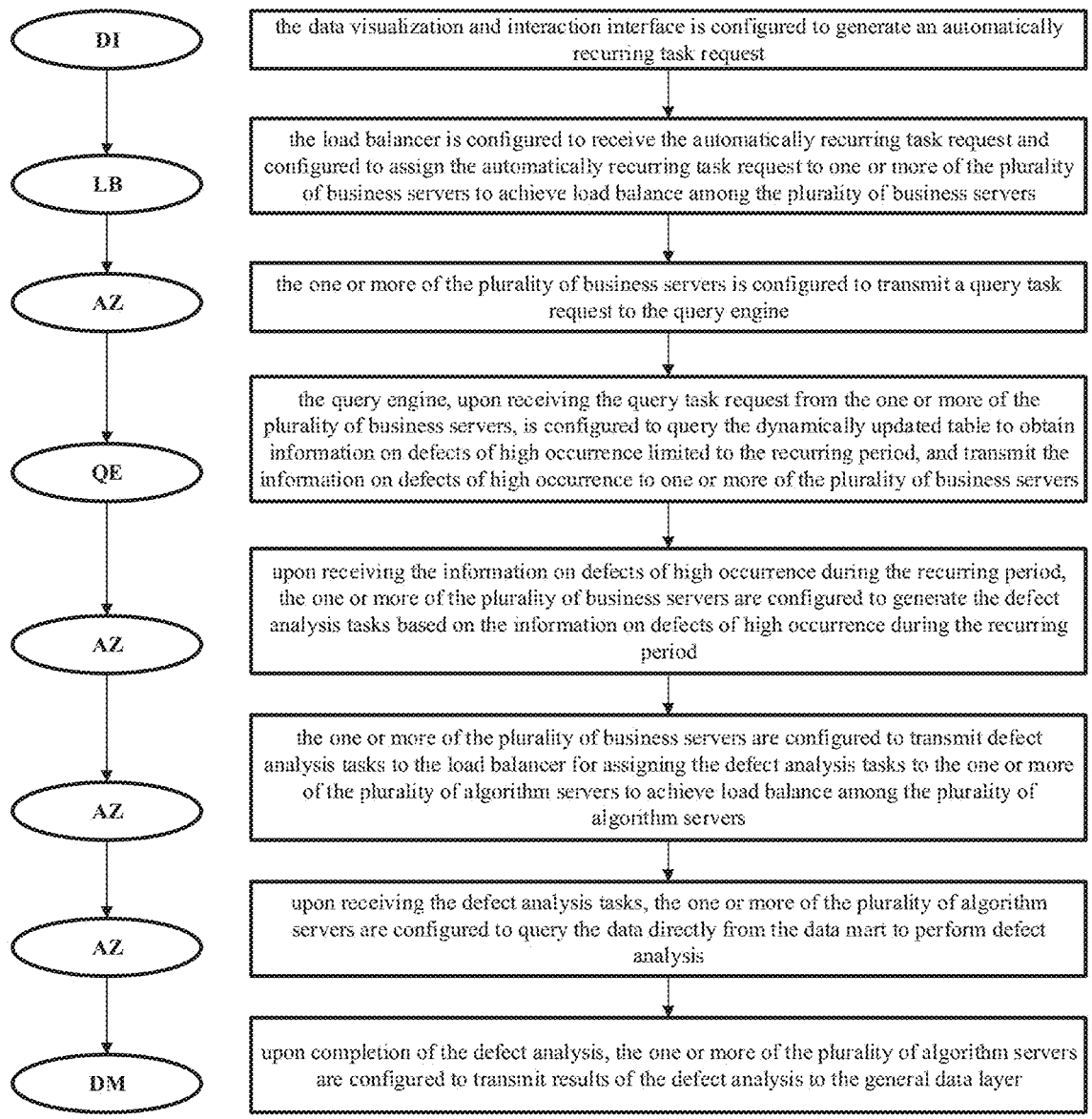
FIG. 13 illustrates an intelligent defect analysis method using an intelligent defect analysis system in some embodiments according to the present disclosure.

In some embodiments, the task request is an automatically recurring task request, the automatically recurring task request defining a recurring period for which the defect analysis is to be performed. FIG. 13 illustrates an intelligent defect analysis method using an intelligent defect analysis system in some embodiments according to the present disclosure. Referring to FIG. 13, in some embodiments, the data visualization and interaction interface DI is configured to generate an automatically recurring task request; the load balancer LB is configured to receive the automatically recurring task request and configured to assign the automatically recurring task request to one or more of the plurality of business servers to achieve load balance among the plurality of business servers; the one or more of the plurality of business servers are configured to transmit a query task request to the query engine QE; the query engine QE, upon receiving the query task request from the one or more of the plurality of business servers, is configured to query the dynamically updated table to obtain information on defects of high occurrence limited to the recurring period, and transmit the information on defects of high occurrence to one or more of the plurality of business servers; upon receiving the information on defects of high occurrence during the recurring period, the one or more of the plurality of business servers are configured to generate the defect analysis tasks based on the information on defects of high occurrence during the recurring period; the one or more of the plurality of business servers are configured to transmit defect analysis tasks to the load balancer LB for assigning the defect analysis tasks to the one or more of the plurality of algorithm servers to achieve load balance among the plurality of algorithm servers; upon receiving the defect analysis tasks, the one or more of the plurality of algorithm servers are configured to obtain the data directly from the data mart DMT to perform defect analysis; and upon completion of the defect analysis, the one or more of the plurality of algorithm servers are configured to transmit results of the defect analysis to the general data layer GDL.

Referring to FIG. 11, the data visualization and interaction interface DI in some embodiments includes an automatic task sub-interface SUB1 allowing input of the recurring period for which the defect analysis is to be performed. The automatic task sub-interface SUB1 enables automatic defect analysis of defects of high occurrence periodically. In the automatic task mode, the information on defects of high occurrence is transmitted to the plurality of algorithm servers AS for analyzing the underlying reasons for causing the defects. In on example, a user sets up the recurring period for which the defect analysis is to be performed in the automatic task sub-interface SUB1. The query engine QE regularly captures the defect information from the dynamically updated table based on the system settings, and sends the information to the plurality of algorithm servers AS for analysis. In this way, the system can automatically monitor the defects of high occurrence, and the corresponding analysis results can be stored in a cache ready to be accessed for display in the data visualization and interaction interface DI.

Figure 14:
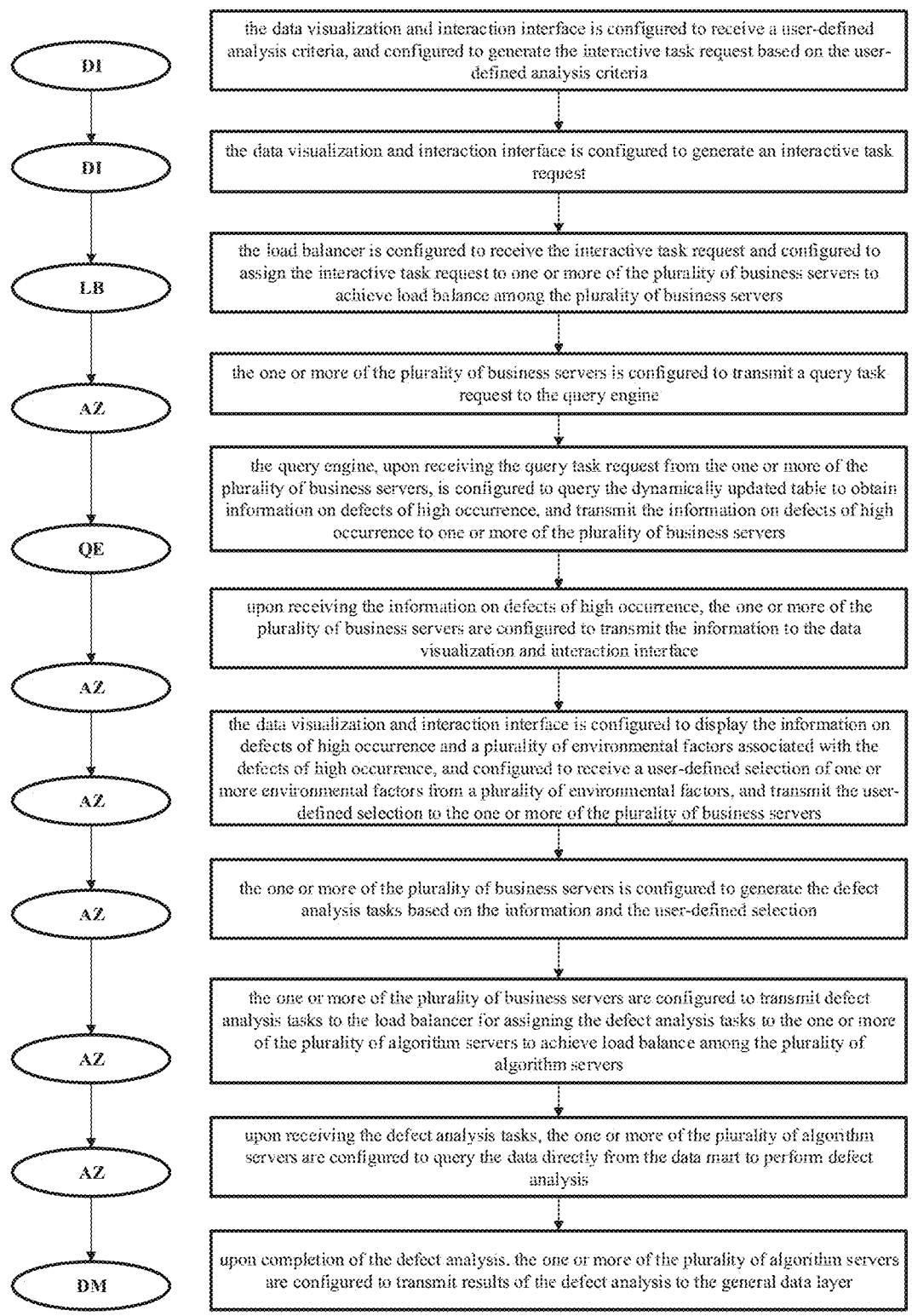
FIG. 14 illustrates an intelligent defect analysis method using an intelligent defect analysis system in some embodiments according to the present disclosure.

In some embodiments, the task request is an interactive task request. FIG. 14 illustrates an intelligent defect analysis method using an intelligent defect analysis system in some embodiments according to the present disclosure. Referring to FIG. 14, in some embodiments, the data visualization and interaction interface DI is configured to receive a user-defined analysis criteria, and configured to generate the interactive task request based on the user-defined analysis criteria; the data visualization and interaction interface DI is configured to generate an interactive task request; the load balancer LB is configured to receive the interactive task request and configured to assign the interactive task request to one or more of the plurality of business servers to achieve load balance among the plurality of business servers; the one or more of the plurality of business servers are configured to transmit a query task request to the query engine; the query engine QE, upon receiving the query task request from the one or more of the plurality of business servers, is configured to query the dynamically updated table to obtain information on defects of high occurrence, and transmit the information on defects of high occurrence to one or more of the plurality of business servers; upon receiving the information on defects of high occurrence, the one or more of the plurality of business servers are configured to transmit the information to the data visualization and interaction interface; the data visualization and interaction interface DI is configured to display the information on defects of high occurrence and a plurality of environmental factors associated with the defects of high occurrence, and configured to receive a user-defined selection of one or more environmental factors from a plurality of environmental factors, and transmit the user-defined selection to the one or more of the plurality of business servers; the one or more of the plurality of business servers are configured to generate the defect analysis tasks based on the information and the user-defined selection; the one or more of the plurality of business servers are configured to transmit defect analysis tasks to the load balancer LB for assigning the defect analysis tasks to the one or more of the plurality of algorithm servers to achieve load balance among the plurality of algorithm servers; upon receiving the defect analysis tasks, the one or more of the plurality of algorithm servers are configured to obtain the data directly from the data mart DMT to perform defect analysis; and upon completion of the defect analysis, the one or more of the plurality of algorithm servers are configured to transmit results of the defect analysis to the general data layer GDL.

Referring to FIG. 11, the data visualization and interaction interface DI in some embodiments includes an interactive task sub-interface SUB2 allowing input of the user-defined analysis criteria including the user-defined selection of one or more environmental factors. In one example, the user may filter various environmental factors, level-by-level, including data source, factory, manufacturing site, model, product model, lot, etc. in the interactive task sub-interface SUB2. The one or more of the plurality of business servers BS are configured to generate the defect analysis tasks based on the information on defects of high occurrence and the user-defined selection of one or more environmental factors. The analyzer AZ interacts with the general data layer GDL continuously, and causes the selected one or more environmental factors to be displayed on the interactive task sub-interface SUB2. The interactive task sub-interface SUB2 allows a user, based on the user's experience, limit the environmental factors to a few, for example, certain selected equipment or certain selected parameters.

In some embodiments, the general data layer GDL is configured to generate tables based on different themes. In one example, the tables include a tracking table containing biographical information, which contains information of sites and devices that glass or panel has passed through during the entire fabrication process. In another example, the tables include a dv table containing parameter information uploaded by the devices. In another example, if the user only wants to analyze equipment correlation, the user can select the tracking table for analysis. In another example, if the user only wants to analyze the equipment parameters, the user can select the dv table for analysis.

Referring to FIG. 11, the analyzer AZ in some embodiments further includes a cache server CS and a cache C. The cache C is connected to the plurality of business servers BS, the cache server CS, and the query engine QE, The cache C is configured to store a portion of results of previously performed defect analysis tasks. In some embodiments, the data visualization and interaction interface DI further includes a defect visualization sub-interface SUB-3. In one example, a main function of the defect visualization sub-interface SUB-3 is to allow a user to customize the query and display corresponding results of previously performed defect analysis tasks upon a user clicking on a defect code. In one example, the user clicks on the defect code and the system sends the request to one or more of the plurality of business servers BS via the load balancer LB. The one or more of the plurality of business servers BS first queries result data cached in the cache C, and the system displays the cached result data directly if it exists. If the result data corresponding to the selected defect code is not presently cached in the cache C, the query engine QE is configured to query the general data layer GDL for the result data corresponding to the selected defect code. Once queried, the system caches the result data corresponding to the selected defect code in the cache C, which may be available for a next query on the same defect code.

Figure 15:
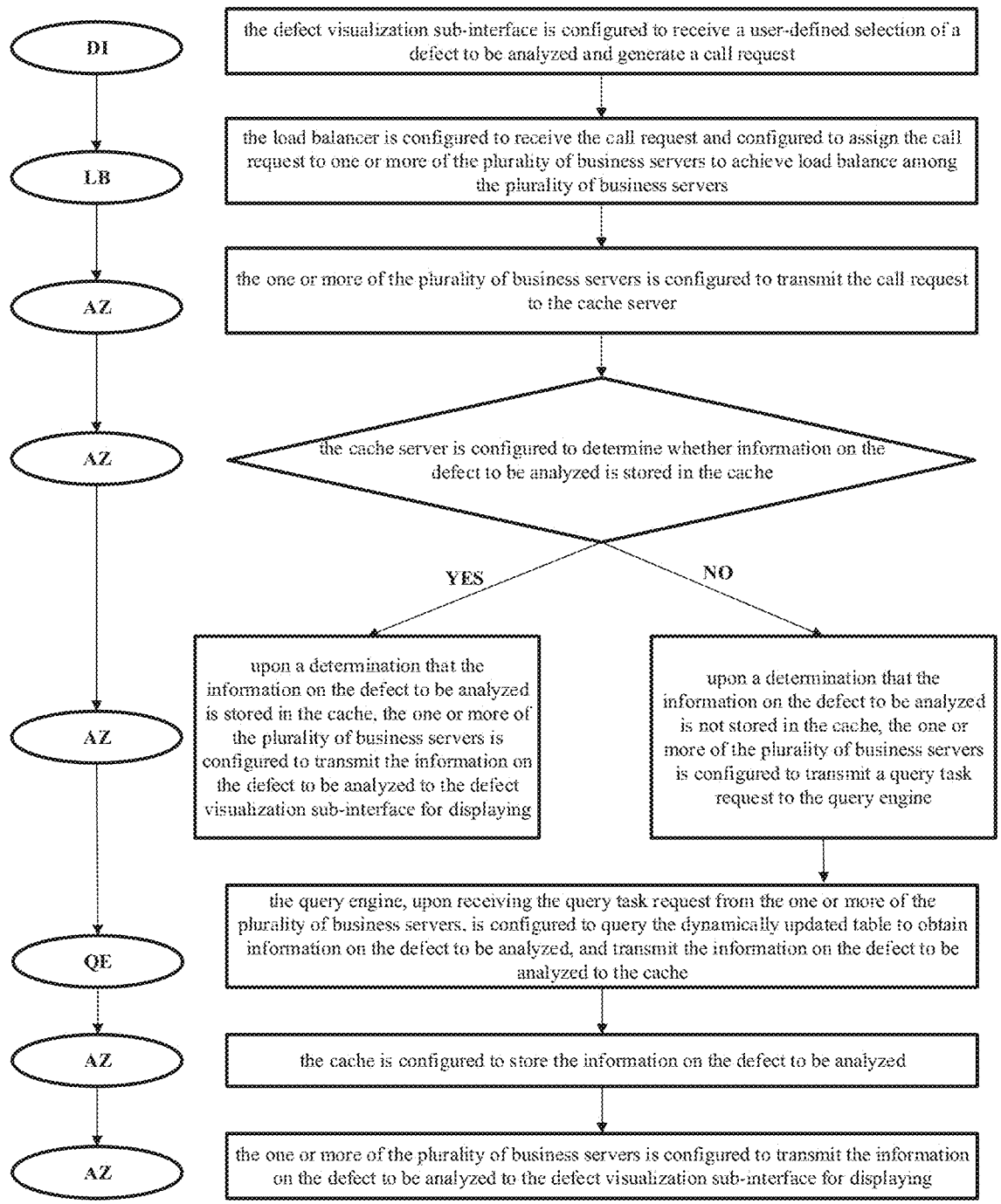
FIG. 15 illustrates an intelligent defect analysis method using an intelligent defect analysis system in some embodiments according to the present disclosure.

FIG. 15 illustrates an intelligent defect analysis method using an intelligent defect analysis system in some embodiments according to the present disclosure. Referring to FIG. 15, in some embodiments, the defect visualization sub-interface DI is configured to receive a user-defined selection of a defect to be analyzed and generate a call request; the load balancer LB is configured to receive the call request and configured to assign the call request to one or more of the plurality of business servers to achieve load balance among the plurality of business servers; the one or more of the plurality of business servers is configured to transmit the call request to the cache server; and the cache server is configured to determine whether information on the defect to be analyzed is stored in the cache. Optionally, upon a determination that the information on the defect to be analyzed is stored in the cache, the one or more of the plurality of business servers is configured to transmit the information on the defect to be analyzed to the defect visualization sub-interface for displaying. Optionally, upon a determination that the information on the defect to be analyzed is not stored in the cache, the one or more of the plurality of business servers is configured to transmit a query task request to the query engine; the query engine, upon receiving the query task request from the one or more of the plurality of business servers, is configured to query the dynamically updated table to obtain information on the defect to be analyzed, and transmit the information on the defect to be analyzed to the cache; the cache is configured to store the information on the defect to be analyzed; and the one or more of the plurality of business servers is configured to transmit the information on the detect to be analyzed to the detect visualization sub-interface for displaying.

Optionally, the portion of results of previously performed defect analysis tasks includes results of previously performed defect analysis tasks based on automatically recurring task requests. Optionally, the portion of results of previously performed defect analysis tasks includes results of previously performed defect analysis tasks based on automatically recurring task requests; and results of previously performed defect analysis tasks obtained based on the query task request.

By having the cache server CS, high demand on the response speed of the system (e.g., displaying results associated with a defect code) can be met. In one example, up to as much as 40 tasks may be generated every half an hour by the automatic recurring task requests, with each task associated with up to five different defect codes, and each defect code associated with up to 100 environmental factors. If all the analysis results are cached, a total number of 40*5*100=20,000 queries will have to be stored in the cache C, which will be puts a lot of pressure on cluster memory. In one example, the portion of results of previously performed defect analysis tasks are limited to results associated with the top three highest ranked defect codes, and only this portion is cached.

Figure 18:
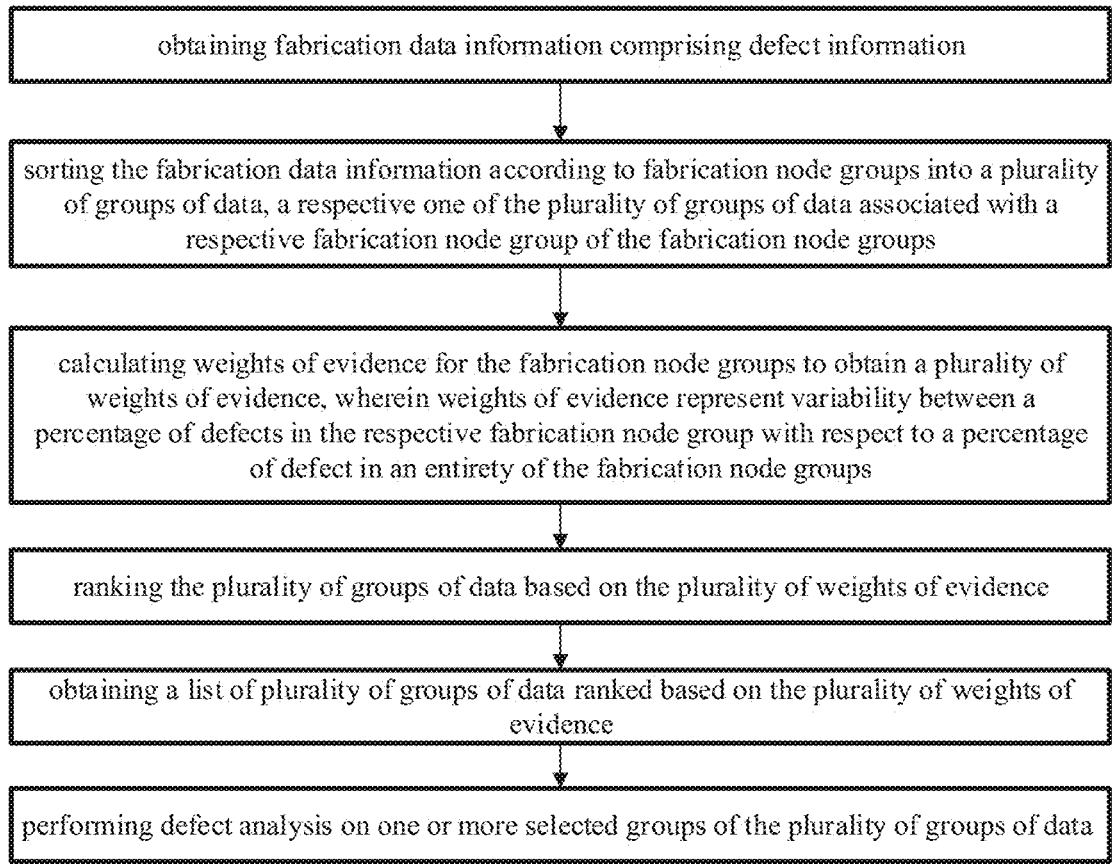
FIG. 18 illustrates a method of defect analysis in some embodiments according to the present disclosure.

Various appropriate methods for defect analysis may be implemented by one or more of the plurality of algorithm servers of the intelligent defect analysis system described herein. FIG. 18 illustrates a method of defect analysis in some embodiments according to the present disclosure. Referring to FIG. 18, in some embodiments, the method includes obtaining fabrication data information comprising defect information; sorting the fabrication data information according to fabrication node groups into a plurality of groups of data, a respective one of the plurality of groups of data associated with a respective fabrication node group of the fabrication node groups; calculating weights of evidence for the fabrication node groups to obtain a plurality of weights of evidence, wherein weights of evidence represent variability between a percentage of defects in the respective fabrication node group with respect to a percentage of defects in an entirety of the fabrication node groups; ranking the plurality of groups of data based on the plurality of weights of evidence; obtaining a list of plurality of groups of data ranked based on the plurality of weights of evidence; and performing defect analysis on one or more selected groups of the plurality of groups of data. Optionally, the respective fabrication node group comprises one or more selected from a group consisting of a fabrication procedure, a device, a site, and a process section. Optionally, the fabrication data information may be obtained from the data mart DMT. Optionally, the fabrication data information may be obtained from the general data layer GDL.

Optionally, the method includes processing fabrication data information comprising biographical data information, defect information, to obtain a processed data; sorting the processed data according to equipment groups into a plurality of groups of data, a respective one of the plurality of groups of data associated with a respective equipment group of the equipment groups; calculating weights of evidence for the equipment groups to obtain a plurality of weights of evidence; ranking the plurality of groups of data based on the plurality of weights of evidence; and performing defect analysis on one or more groups of the plurality of groups of data having highest ranking. Optionally, the defect analysis is performed on a parameter level.

In some embodiments, a respective weight of evidence for the respective equipment group is calculated according to Equation (2):

$$woe_i = In\frac{P(y_i)}{p(n_i)} = In\frac{\#y_i/\#y_r}{\#n_i/\#n_r};$$ (2)

wherein $woe_i$ stands for the respective weight of evidence for the respective equipment group; P(yi) stands for a ratio of a nwnber of positive samples in the respective equipment group to a number of positive samples in all fabrication node groups (e.g., equipment groups); P(ni) stands for a ratio of a number of negative samples in the respective equipment group to a number of negative samples in all fabrication node groups (e.g., equipment groups); the positive samples means data including defect information associated with the respective equipment group; the negative samples means data in which defect information associated with the respective equipment group is absent; #yi stands for the number of positive samples in the respective equipment group; #yr stands for the number of positive samples in all fabrication node groups (e.g., equipment groups); #ni stands for the number of negative samples in the respective equipment group; #yr stands for the number of negative samples in all fabrication node groups (e.g., equipment groups).

In some embodiments, the method further includes processing the fabrication data information to obtain a processed data. Optionally, processing the fabrication data information comprises performing data fusion on biographical data information and defect information to obtain a fused data information.

In one example, processing fabrication data information to obtain a processed data includes obtaining raw data information of various fabrication processes of a display panel, including biographical data information, parameter information, and defect information; pre-processing the raw data to remove null data, redundant data, and dummy field, and filtering the data based on pre-set conditions, to obtain a validated data; performing data fusion on the biographical data information and the defect information in the validated data to obtain a third fused data information; determining if any piece of defect information in the fused data information contains a machine-detected defect information and a manually reviewed defect information in a same piece, and marking the manually reviewed defect information as the defect information to be analyzed instead of the machine-detected defect information, thereby generating a reviewed data; performing data fusion on the review data and the biographical data information to obtain a fourth fused data information; and removing non-representative data from the fourth fused data information to obtain the processed data. For example, data generated in a process in which the glass passes through a very small number of devices can be eliminated. When the number of devices the glass passed through is only a small percentage (e.g., 10%) of the total number of devices, the non-representative data will bias the analysis, affecting accuracy of the analysis.

In one example, the biographical data information (used to be fused with the review data to obtain the fourth fused data information) includes glass data and hglass data (half glass data, i.e., the history data after the complete glass is cut in half). The reviewed data, however, is panel data. In one example, the glass_id/hglass_id at fab stage is fused with the panel_id at EAC2 stage, with redundant data removed. The purpose of this step is to ensure the biographical data information at the fab stage are consistent with the defect information at the EAC2 stage. For example, the number of bits in the glass_id/hglass_id is not the same as the number of bits in the panel_id. In one example, the number of bits in the panel_id is processed to be consistent with the number of bits in the glass_id/hglass_id. After the data fusion, a data with complete information is obtained, including glass_id/hglass_id, site information, equipment information, defect information. Optionally, the fused data is subject to an additional operation to remove redundant data items.

In some embodiments, performing the defect analysis includes performing feature extraction on parameters of various types to generate parameter feature information, wherein one or more of a maximum value, a minimum value, an average value, and a median value are extracted for each type of parameters. Optionally, performing feature extraction includes performing time domain analysis to extract statistics information comprising one or more of count, mean value, maximum value, minimum value, range, variance, bias, kurtosis, and percentile. Optionally, performing feature extraction includes performing frequency domain analysis to convert time domain information obtained in the time domain analysis into frequency domain information comprising one or more of power spectrum, information entropy, and signal-to-noise ratio.

In one example, the feature extraction is performed on a list of plurality of groups of data ranked based on the plurality of weights of evidence. In another example, the feature extraction is performed on one or more groups of the plurality of groups of data having highest ranking. In another example, the feature extraction is performed on the group of data having the highest ranking.

In some embodiments, performing the defect analysis further includes performing data fusion on at least two of parameter feature information, biographical information of the manufacturing process, and defect information associated therewith. Optionally, performing data fusion includes performing data fusion on parameter feature infmmation and defect information associated therewith. Optionally, performing data fusion includes performing data fusion on parameter feature information, biographical information of the manufacturing process, and defect information associated therewith. In another example, performing data fusion on the parameter feature information and biographical information of the manufacturing process to obtain first fused data information; and performing data fusion on the first fused data information and defect information associated therewith to obtain second fused data information, the second fused data information comprising glass serial number, manufacturing site information, device information, the parameter feature information, and the defect information. In some embodiments, the data fusion is performed in the general data layer GDL, e.g., by building tables having correlation constructed according to user needs or themes as discussed above.

Figure 19:
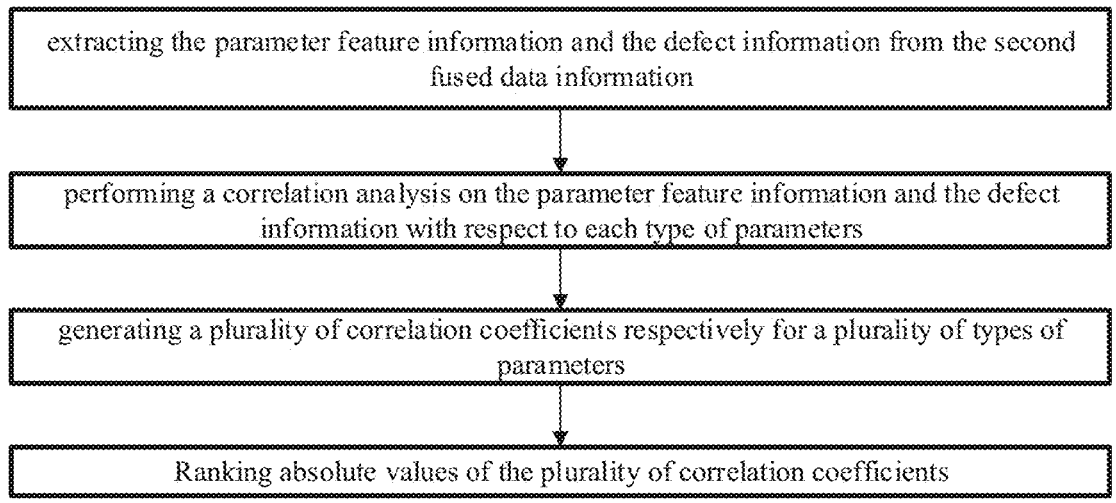
FIG. 19 illustrates a method of defect analysis in some embodiments according to the present disclosure.

In some embodiments, the method further includes performing a correlation analysis. FIG. 19 illustrates a method of defect analysis in some embodiments according to the present disclosure. Referring to FIG. 19, the method in some embodiments includes extracting the parameter feature information and the defect information from the second fused data information; performing a correlation analysis on the parameter feature information and the defect information with respect to each type of parameters; generating a plurality of correlation coefficients respectively for a plurality of types of parameters; and ranking absolute values of the plurality of correlation coefficients. In one example, the absolute values of the plurality of correlation coefficients are ranked in order from largest to smallest, so that associated parameters that lead to the defect occurrence can be observed visually. The absolute values are used here because the correlation coefficients can be positive or negative values, i.e., there can be a positive or a negative correlation between the parameter and the defect. The larger the absolute value is, the stronger the correlation.

In some embodiments, the plurality of correlation coefficients are a plurality of pearson correlation coefficients. Optionally, a respective pearson correlation coefficients is calculated according to Equation (3):

$$\rho_{x,y} = \frac{\text{cov}(x, y)}{\sigma_x \sigma_y} = \frac{E((x - \mu_x)(y - \mu_y))}{\sigma_x \sigma_y} = \frac{E(xy) - E(x)E(y)}{\sqrt{E(x^2) - E^2(x)} \sqrt{E(y^2) - E^2(y)}}; \quad (3)$$

wherein x stands for a value for a parameter feature; y stands for a value for presence or absence of a defect, y is given a value of 1 when the defect is present, and y is given a value of 0 when the defect is absent; $\mu_x$ stands for a mean value of x; $\mu_y$ stands for a mean value of y; $\sigma_x \sigma_y$ stands for a product of respective standard deviations of x and y; cov(x,y) stands for a covariance of x,y; and $\rho(x,y)$ stands for a respective pearson correlation coefficient.

In another aspect, the present disclosure provides an intelligent defect analysis method performed by a distributed computing system including one or more networked computers configured to execute in parallel to perform at least one common task. In some embodiments, the method includes executing a data management platform configured to store data, and intelligently extract, transform, or load the data; executing a query engine connected to the data management platform and configured to obtain the data directly from the data management platform; executing an analyzer connected to the query engine and configured to perform defect analysis upon receiving a task request, the analyzer including a plurality of backend servers and a plurality of algorithm servers, the plurality of algorithm servers configured to obtain the data directly from the data management platform; and executing a data visualization and interaction interface configured to generate the task requests.

In some embodiments, the data management platform comprises an ETL module configured to extract, transform, or load data from a plurality of data sources onto a data mart and a general data layer. The method in some embodiment further includes querying, by a respective one of the plurality of algorithm servers, a first data directly from the data mart, upon receiving an assigned task by the respective one of the plurality of algorithm servers; and transmitting, by the respective one of the plurality of algorithm servers, a second data directly to the general data layer, upon performing defect analysis.

In some embodiments, the method further includes generating, by the ETL module, a dynamically updated table that is automatically updated periodically; and storing the dynamically updated table in the general data layer.

In some embodiments, the software modules further include a load balancer connected to the analyzer. In some embodiments, the method further includes receiving, by the load balancer, task requests and assigning, by the load balancer, the task requests to one or more of the plurality of backend servers to achieve load balance among the plurality of backend servers, and assigning, by the load balancer, tasks from the plurality of backend servers to one or more of the plurality of algorithm servers to achieve load balance among the plurality of algorithm servers.

In some embodiments, the method further includes generating, by the data visualization and interaction interface, a task request; receiving, by the load balancer, the task request and assigning, by the load balancer, the task request to one or more of the plurality of backend servers to achieve load balance among the plurality of backend servers; transmitting, by the one or more of the plurality of backend servers, a query task request to the query engine; querying, by the query engine, the dynamically updated table to obtain information on defects of high occurrence, upon receiving the query task request from the one or more of the plurality of backend servers by the query engine; transmitting, by the query engine, the information on defects of high occurrence to one or more of the plurality of backend servers; transmitting, by the one or more of the plurality of backend servers, defect analysis tasks to the load balancer for assigning the defect analysis tasks to the one or more of the plurality of algorithm servers to achieve load balance among the plurality of algorithm servers; querying, by the one or more of the plurality of algorithm servers, the data directly from the data mart to perform defect analysis, upon receiving the defect analysis tasks by the one or more of the plurality of algorithm servers; and upon completion of the detect analysis, transmitting, by the one or more of the plurality of algorithm servers, results of the defect analysis to the general data layer.

In some embodiments, the method further includes generating an automatically recurring task request. The automatically recurring task request defining a recurring period for which the defect analysis is to be performed. Optionally, the method further includes querying, by the query engine, the dynamically updated table to obtain information on defects of high occurrence limited to the recurring period; and generating, by the one or more of the plurality of backend servers upon receiving the intermation on defects of high occurrence during the recurring period, the defect analysis tasks based on the information on defects of high occurrence during the recurring period. Optionally, the method further includes receiving input of the recurring period for which the defect analysis is to be performed, e.g., by an automatic task sub-interface of the data visualization and interaction interface.

In some embodiments, the method further includes generating an interactive task request. Optionally, the method further includes receiving, by the data visualization and interaction interface, a user-defined analysis criteria; generating, by the data visualization and interaction interface, the interactive task request based on the user-defined analysis criteria; transmitting, by the one or more of the plurality of backend servers upon receiving the information on defects of high occurrence, the information to the data visualization and interaction interface; displaying, by the data visualization and interaction interface, the information on defects of high occurrence and a plurality of environmental factors associated with the defects of high occurrence; receiving, by the data visualization and interaction interface, a user-defined selection of one or more environmental factors from a plurality of environmental factors; transmitting, by the data visualization and interaction interface, the user-defined selection to the one or more of the plurality of backend, servers; and generating, by the one or more of the plurality of backend servers, the defect analysis tasks based on the information and the user-defined selection. Optionally, the method further includes receiving input of the user-defined analysis criteria, comprising the user-defined selection of one or more environmental factors, e.g., by an interactive task sub-interface of the data visualization and interaction interface.

In some embodiments, the analyzer further includes a cache server and a cache. The cache is connected to the plurality of backend servers, the cache server, and the query engine. Optionally, the method further includes storing, by the cache, a portion of results of previously performed defect analysis tasks.

In some embodiments, the data visualization and interaction interface includes a defect visualization sub-interface. Optionally, the method further includes receiving, by the defect visualization sub-interface, a user-defined selection of a defect to be analyzed and generate a call request; receiving, by the load balancer, the call request; assigning, by the load balancer, the call request to one or more of the plurality of backend servers to achieve load balance among the plurality of backend servers; transmitting, by the one or more of the plurality of backend servers, the call request to the cache server; and determining, by the cache server, whether information on the defect to be analyzed is stored in the cache. Optionally, the method further includes upon a determination that the information on the defect to be analyzed is stored in the cache, the one or more of the plurality of backend servers is configured to transmit the information on the defect to be analyzed to the defect visualization sub-interface for displaying. Optionally, the method further includes transmitting, by the one or more of the plurality of backend servers, a query task request to the query engine, upon a determination that the information on the defect to be analyzed is not stored in the cache; querying, by the query engine upon receiving the query task request from the one or more of the plurality of backend servers, the dynamically updated table to obtain information on the detect to be analyzed; transmitting, by the query engine, the information on the defect to be analyzed to the cache; storing the information on the defect to be analyzed in the cache; and transmitting, by the one or more of the plurality of backend servers, the information on the defect to be analyzed to the defect visualization sub-interface for displaying. Optionally, the portion of results of previously performed defect analysis tasks includes results of previously performed defect analysis tasks based on automatically recurring task requests; and results of previously performed defect analysis tasks obtained based on the query task request.

In another aspect, the present disclosure provides a computer-program product, for intelligent defect analysis. The computer-program product, for intelligent defect analysis includes a non-transitory tangible computer-readable medium having computer-readable instructions thereon. In some embodiments, the computer-readable instructions are executable by a processor, in a distributed computing system including one or more networked computers configured to execute in parallel to perform at least one common task, to cause the processor to perform executing a data management platform configured to store data, and intelligently extract, transform, or load the data; executing a query engine connected to the data management platform and configured to obtain the data directly from the data management platform; executing an analyzer connected to the query engine and configured to perform defect analysis upon receiving a task request, the analyzer including a plurality of backend servers and a plurality of algorithm servers, the plurality of algorithm servers configured to obtain the data directly from the data management platform; and executing a data visualization and interaction interface configured to generate the task requests.

In some embodiments, the data management platform comprises an ETL module configured to extract, transform, or load data from a plurality of data sources onto a data mart and a general data layer. In some embodiment, the computer-readable instructions are further executable by a processor, in the distributed computing system, to cause the processor to perform querying, by a respective one of the plurality of algorithm servers, a first data directly from the data mart, upon receiving an assigned task by the respective one of the plurality of algorithm servers; and transmitting, by the respective one of the plurality of algorithm servers, a second data directly to the general data layer, upon performing defect analysis.

In some embodiments, the computer-readable instructions are further executable by a processor, in the distributed computing system, to cause the processor to perform generating, by the ETL module, a dynamically updated table that is automatically updated periodically; and storing the dynamically updated table in the general data layer.

In some embodiments, the software modules further include a load balancer connected to the analyzer. In some embodiments, the computer-readable instructions are further executable by a processor, in the distributed computing system, to cause the processor to perform receiving, by the load balancer, task requests and assigning, by the load balancer, the task requests to one or more of the plurality of backend servers to achieve load balance among the plurality of backend servers, and assigning, by the load balancer, tasks from the plurality of backend servers to one or more of the plurality of algorithm servers to achieve load balance among the plurality of algorithm servers.

In some embodiments, the computer-readable instructions are further executable by a processor, in the distributed computing system, to cause the processor to perform generating, by the data visualization and interaction interface, a task request; receiving, by the load balancer, the task request and assigning, by the load balancer, the task request to one or more of the plurality of backend servers to achieve load balance among the plurality of backend servers; transmitting, by the one or more of the plurality of backend servers, a query task request to the query engine; querying, by the query engine, the dynamically updated table to obtain information on defects of high occurrence, upon receiving the query task request from the one or more of the plurality of backend servers by the query engine; transmitting, by the query engine, the information on defects of high occurrence to one or more of the plurality of backend servers; transmitting, by the one or more of the plurality of backend servers, defect analysis tasks to the load balancer for assigning the defect analysis tasks to the one or more of the plurality of algorithm servers to achieve load balance among the plurality of algorithm servers; querying, by the one or more of the plurality of algorithm servers, the data directly from the data mart to perform defect analysis, upon receiving the defect analysis tasks by the one or more of the plurality of algorithm servers; and upon completion of the defect analysis, transmitting, by the one or more of the plurality of algorithm servers, results of the defect analysis to the general data layer.

In some embodiments, the computer-readable instructions are further executable by a processor, in the distributed computing system, to cause the processor to perform generating an automatically recurring task request. The automatically recurring task request defining a recurring period for which the defect analysis is to be performed. Optionally, the computer-readable instructions are further executable by a processor, in the distributed computing system, to cause the processor to perform querying, by the query engine, the dynamically updated table to obtain information on defects of high occurrence limited to the recurring period; and generating, by the one or more of the plurality of backend servers upon receiving the information on defects of high occurrence during the recurring period, the defect analysis tasks based on the information on defects of high occurrence during the recurring period. Optionally, the computer-readable instructions are further executable by a processor, in the distributed computing system, to cause the processor to perform receiving input of the recurring period for which the defect analysis is to be performed, e.g., by an automatic task sub-interface of the data visualization and interaction interface.

In some embodiments, the computer-readable instructions are further executable by a processor, in the distributed computing system, to cause the processor to perform generating interactive task request. Optionally, the computer-readable instructions are further executable by a processor, in the distributed computing system, to cause the processor to perform receiving, by the data visualization and interaction interface, a user-defined analysis criteria; generating, by the data visualization and interaction interface, the interactive task request based on the user-defined analysis criteria; transmitting, by the one or more of the plurality of backend servers upon receiving the information on defects of high occurrence, the information to the data visualization and interaction interface; displaying, by the data visualization and interaction interface, the information on defects of high occurrence and a plurality of environmental factors associated with the defects of high occurrence; receiving, by the data visualization and interaction interface, a user-defined selection of one or more environmental factors from a plurality of environmental factors; transmitting, by the data visualization and interaction interface, the user-defined selection to the one or more of the plurality of backend servers; and generating, by the one or more of the plurality of backend servers, the defect analysis tasks based on the information and the user-defined selection. Optionally, the computer-readable instructions are further executable by a processor, in the distributed computing system, to cause the processor to perform receiving input of the user-defined, analysis criteria comprising the user-defined selection of one or more environmental factors, e.g., by an interactive task sub-interface of the data visualization and interaction interface.

In some embodiments, the analyzer further includes a cache server and a cache. The cache is connected to the plurality of backend servers, the cache server, and the query engine. Optionally, the computer-readable instructions are further executable by a processor, in the distributed computing system, to cause the processor to perform storing, by the cache, a portion of results of previously performed defect analysis tasks.

In some embodiments, the data visualization and interaction interface include a defect visualization sub-interface. Optionally, the computer-readable instructions are further executable by a processor, in the distributed computing system, to cause the processor to perform receiving, by the defect visualization sub-interface, a user-defined selection of a defect to be analyzed and generate a call request; receiving, by the load balancer, the call request; assigning, by the load balancer, the call request to one or more of the plurality of backend servers to achieve load balance among the plurality of backend servers; transmitting, by the one or more of the plurality of backend servers, the call request to the cache server; and determining, by the cache server, whether information on the defect to be analyzed is stored in the cache. Optionally, the computer-readable instructions are further executable by a processor, in the distributed computing system, to cause the processor to perform upon a determination that the information on the defect to be analyzed is stored in the cache, the one or more of the plurality of backend servers is configured to transmit the information on the defect to be analyzed to the defect visualization sub-interface for displaying. Optionally, the computer-readable instructions are further executable by a processor, in the distributed computing system, to cause the processor to perform transmitting, by the one or more of the plurality of backend servers, a query task request to the query engine, upon a determination that the information on the defect to be analyzed is not stored in the cache; querying, by the query engine upon receiving the query task request from the one or more of the plurality of backend servers, the dynamically updated table to obtain information on the defect to be analyzed; transmitting, by the query engine, the information on the defect to be analyzed to the cache; storing the information on the defect to be analyzed in the cache;

and transmitting, by the one or more of the plurality of backend servers, the information on the defect to be analyzed to the defect visualization sub-interface for displaying. Optionally, the portion of results of previously performed defect analysis tasks includes results of previously performed defect analysis tasks based on automatically recurring task requests; and results of previously performed defect analysis tasks obtained based on the query task request.

Various illustrative operations described in connection with the configurations disclosed herein may be implemented as electronic hardware, computer software, or combinations of both. Such operations may be implemented or performed with a general purpose processor, a digital signal processor (DSP), an ASIC or ASSP, an FPGA or other programmable logic device, discrete gate or transistor logic, discrete hardware components, or any combination thereof designed to produce the configuration as disclosed herein. For example, such a configuration may be implemented at least in part as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a general purpose processor or other digital signal processing unit. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A software module may reside in a non-transitory storage medium such as RAM (random-access memory), ROM (read-only memory), nonvolatile RAM (NVRAM) such as flash RAM, erasable programmable ROM (EPROM), electrically erasable programmable ROM (EEPROM), registers, hard disk, a removable disk, or a CD-ROM; or in any other form of storage medium known in the art. An illustrative storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific nwnber has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An intelligent defect analysis system, comprising:
a distributed computing system comprising one or more networked computers configured to execute in parallel to perform at least one common task;
one or more computer readable storage mediums storing instructions that, when executed by the distributed computing system, cause the distributed computing system to execute software modules;
wherein the software modules comprise:
a data manager configured to store data, and intelligently extract, transform, or load the data;
a query engine connected to the data manager and configured to query the data directly from the data manager;
an analyzer connected to the query engine and configured to perform defect analysis upon received a task request, the analyzer comprising a plurality of business servers and a plurality of algorithm servers, the plurality of algorithm servers configured to query the data directly from the data manager; and
a data visualization and interaction interface configured to generate the task requests;
wherein the data visualization and interaction interface comprises an automatic task sub-interface configured to receive input of the recurring period for which the defect analysis is to be performed;
wherein the task request is an interactive task request;
the data visualization and interaction interface is configured to receive a user-defined analysis criteria, and configured to generate the interactive task request based on the user-defined analysis criteria;
upon receiving information on defects of interest, the one or more of the plurality of business servers are configured to transmit the information to the data visualization and interaction interface;
the data visualization and interaction interface is configured to display the information on defects of interest and a plurality of environmental factors associated with the defects of interest, and configured to receive a user-defined selection of one or more environmental factors from the plurality of environmental factors, and transmit the user-defined selection to the one or more of the plurality of business servers; and
the one or more of the plurality of business servers are configured to generate the defect analysis tasks based on the information and the user-defined selection;

wherein one or more of the plurality of algorithm servers is configured to perform: a computer-implemented method of evaluating likelihood of defect occurrence, comprising:
obtaining original data on defects occurred during a fabrication period;
pre-processing the original data to obtain pre-processed data;
extracting features from the pre-processed data to obtain first features;
selecting second features from the first features;
inputting the second features into a predictive model; and evaluating likelihood of defect occurrence;
wherein extracting features from the pre-processed data comprises performing at least one of time domain analysis and frequency domain analysis on the pre-processed data;
wherein the predictive model is trained by:
obtaining training original data on defects occurred during a training fabrication period;
pre-processing the training original data to obtain pre-processed training data;
extracting features from the pre-processed training data to obtain third features;
selecting fourth features from the third features; and
tuning parameters of an initial model using the third features to obtain the predictive model for defect prediction;
wherein extracting training features from the pre-processed training data comprises performing at least one of time domain analysis and frequency domain analysis on the pre-processed training data;
wherein tuning parameters of the initial model comprises evaluating a F measure according to Equation (1):

$$\frac{1}{F_\beta} = \frac{1}{1+\beta^2}\left(\frac{1}{P} + \frac{\beta^2}{R}\right);$$

wherein Fβ stands for a harmonic mean of precision and recall, P stands for precision, R stands for recall, β stands for a parameter that controls a balance between P and R.

2. The intelligent defect analysis system of claim 1, wherein the data manager comprises an extract, transform, load (ETL) module configured to extract, transform, or load data from the plurality of data sources onto a data mart that is a database of non-structured query language (No-SQL) type NoSQL type; and
upon receiving an assigned task, a respective one of the plurality of algorithm servers is configured to obtain a first data from the data mart.

3. The intelligent defect analysis system of claim 2, wherein the ETL module is further configured to extract, transform, or load data from the plurality of data sources onto a general data layer that is a distributed data storage storing information;
upon performing defect analysis, the respective one of the plurality of algorithm servers is configured to transmit a second data to the general data layer;
the ETL module is configured to generate a dynamically updated table that is automatically updated periodically; and
the general data layer is configured to store the dynamically updated table.

4. The intelligent defect analysis system of claim 3, wherein the software modules further comprise a query engine connected to the data manager and configured to obtain the managed data from the data manager.

5. The intelligent defect analysis system of claim 4, wherein
the analyzer further comprises a plurality of business servers;
upon receiving the task request, the one or more of the plurality of business servers are configured to transmit a query task request to the query engine;
the query engine, upon receiving the query task request from the one or more of the plurality of business servers, is configured to query the dynamically updated table to obtain information on defects of interest, and transmit the information on defects of interest to one or more of the plurality of business servers;
upon receiving defect analysis tasks, the one or more of the plurality of algorithm servers are configured to obtain the first data from the data mart to perform defect analysis; and
upon completion of the defect analysis, the one or more of the plurality of algorithm servers are configured to transmit results of the defect analysis to the general data layer.

6. The intelligent defect analysis system of claim 5, wherein the task request is an automatically recurring task request, the automatically recurring task request defining a periodical recurring period for which the defect analysis is to be performed;
the query engine is configured to query the dynamically updated table to obtain the information on defects of interest limited to the periodical recurring period; and
upon receiving the information on defects of interest during the periodical recurring period, the one or more of the plurality of business servers are configured to generate the defect analysis tasks based on the information on defects of interest during the periodical recurring period.

7. The intelligent defect analysis system of claim 4, wherein the analyzer further comprises a plurality of business servers; and
the software modules further comprise a load balancer connected to the analyzer, the load balancer configured to receive task requests and configured to assign the task requests to one or more of the plurality of business servers to achieve load balance among the plurality of business servers, and configured to assign tasks from the plurality of business servers to one or more of the plurality of algorithm servers to achieve load balance among the plurality of algorithm servers.

8. The intelligent defect analysis system of claim 7, wherein the task requests are assigned to each of the one or more of the plurality of business servers based on a number of tasks currently performed by each of the plurality of business servers and an amount of computational burden required by each task currently performed by each of the plurality of business servers, to achieve an optimal load balance among the plurality of business servers.

9. The intelligent defect analysis system of claim 7, wherein
the load balancer is configured to receive the task request and configured to assign the task request to one or more of the plurality of business servers to achieve load balance among the plurality of business servers;

the one or more of the plurality of business servers are configured to transmit a query task request to the query engine;

the query engine, upon receiving the query task request from the one or more of the plurality of business servers, is configured to query the dynamically updated table to obtain information on defects of interest, and transmit the information on defects of interest to one or more of the plurality of business servers;

the one or more of the plurality of business servers are configured to transmit defect analysis tasks to the load balancer for assigning the defect analysis tasks to the one or more of the plurality of algorithm servers to achieve load balance among the plurality of algorithm servers;

upon receiving the defect analysis tasks, the one or more of the plurality of algorithm servers are configured to query the first data from the data mart to perform defect analysis; and upon completion of the defect analysis, the one or more of the plurality of algorithm servers are configured to transmit results of the defect analysis to the general data layer.

10. The intelligent defect analysis system of claim 1, wherein the time domain analysis extracts statistics information of the pre-processed data.

11. The intelligent defect analysis system of claim 1, wherein the frequency domain analysis converts time domain information obtained in the time domain analysis into frequency domain information.

12. The intelligent defect analysis system of claim 1, wherein selecting second features from the first features comprises performing principal component analysis on the first features.

13. The intelligent defect analysis system of claim 1, wherein pre-processing the original data comprises:
    excluding a first portion of the original data, in which equal to or greater than a threshold percentage of values are missing, from the pre-processed data; and
    for a second portion of the original data, in which less than the threshold percentage of values are missing, providing interpolated values for missing values.

14. The intelligent defect analysis system of claim 1, wherein the initial model is an extreme Gradient Boosting (XGBoost) model.

* * * * *